(12) United States Patent
Shapira

(10) Patent No.: US 12,313,785 B2
(45) Date of Patent: May 27, 2025

(54) LIDAR MODULE AND METHODS THEREOF

(71) Applicant: Intel Corporation, Santa Clara, CA (US)

(72) Inventor: Yuval P. Shapira, Yokneam Illit (IL)

(73) Assignee: Intel Corporation, Santa Clara, CA (US)

( * ) Notice: Subject to any disclaimer, the term of this patent is extended or adjusted under 35 U.S.C. 154(b) by 721 days.

(21) Appl. No.: 17/401,344

(22) Filed: Aug. 13, 2021

(65) Prior Publication Data

US 2021/0389431 A1 Dec. 16, 2021

(51) Int. Cl.
| | |
|---|---|
| *G02B 26/08* | (2006.01) |
| *B81B 3/00* | (2006.01) |
| *G01S 7/481* | (2006.01) |
| *G01S 17/06* | (2006.01) |
| *H10F 30/225* | (2025.01) |

(52) U.S. Cl.
CPC .......... *G01S 7/4817* (2013.01); *B81B 3/0062* (2013.01); *G02B 26/0833* (2013.01); *B81B 2201/042* (2013.01); *G01S 17/06* (2013.01); *H10F 30/225* (2025.01)

(58) Field of Classification Search
CPC ........ G01S 7/4817; G01S 17/06; G01S 17/42; B81B 3/0062; B81B 2201/042; G02B 26/0833; H01L 31/107
See application file for complete search history.

(56) References Cited

U.S. PATENT DOCUMENTS

| | | |
|---|---|---|
| 2005/0253055 A1 | 11/2005 | Sprague et al. |
| 2012/0307260 A1* | 12/2012 | Keshavmurthy .. G01B 11/2513 356/601 |
| 2018/0231640 A1 | 8/2018 | Han et al. |
| 2020/0110259 A1 | 4/2020 | Pastor et al. |
| 2020/0132981 A1 | 4/2020 | Van Lierop et al. |
| 2020/0182975 A1 | 6/2020 | Wang et al. |
| 2020/0319450 A1* | 10/2020 | Druml .................. G02B 26/101 |

FOREIGN PATENT DOCUMENTS

CN 107526071 A 12/2017

OTHER PUBLICATIONS

Partial European Search Report issued for the corresponding EP patent application No. EP 22 18 1217 dated Dec. 9, 2022, 1 page (For informational purposes only).

(Continued)

*Primary Examiner* — Euncha P Cherry
(74) *Attorney, Agent, or Firm* — Viering, Jentschura & Partner mbB

(57) ABSTRACT

A LIDAR module includes: a light detector configured to detect light; a first (MEMS) mirror and a second MEMS mirror, wherein one of the first MEMS mirror or the second MEMS mirror is configured to direct received light towards a field of view of the LIDAR module, wherein the other one of the first MEMS mirror or the second MEMS mirror is configured to receive light from the field of view of the LIDAR module and to direct the light towards the light detector, and wherein the first MEMS mirror and the second MEMS mirror are configured to oscillate in synchronization with one another to cover a same angular range.

18 Claims, 10 Drawing Sheets

(56) References Cited

OTHER PUBLICATIONS

Intel; "Intel® RealSense™ LiDAR Camera L515"; retrieved on Aug. 3, 2021, on https://www.intelrealsense.com/lidar-camera-l515/; 5 pages; Intel® RealSense™.

Innoviz Technologies Ltd.; "InnovizTwo"; retrieved on Aug. 3, 2021, on https://innoviz.tech/innoviztwo; 4 pages; Innoviz Technologies Ltd.

Velodyne Lidar; "Puck"; retrieved on Aug. 3, 2021, on https://velodynelidar.com/products/puck/; 5 pages; Velodyne Lidar.

Wang, Dingkang et al.; "MEMS Mirrors for LiDAR: A Review"; https://www.mdpi.com/2072-666X/11/5/456; Micromachines; published on Apr. 27, 2020; 24 pages; MDPI.

European office action issued for the corresponding European patent application No. 22181217.5, dated Jan. 2, 2025, 10 pages (for informational purposes only).

\* cited by examiner

LIDAR MODULE AND METHODS THEREOF

TECHNICAL FIELD

This disclosure relates generally to a light detection and ranging (LIDAR or LiDAR) module and methods thereof (e.g., a method of operating a LIDAR module, and a method of providing micro-electromechanical systems (MEMS) mirrors).

BACKGROUND

LIDAR is a sensing technology based on the emission and collection of light (e.g., laser light). The light emitted by a LIDAR system is reflected back by the objects present in a scene, and the LIDAR system determines relevant characteristics of the objects (e.g., their location, their velocity, etc.) based on the properties of the emitted and received light. In general, a LIDAR system may be configured as a FLASH LIDAR system or as a scanning LIDAR system. In FLASH LIDAR, the emitted light (e.g., a divergent laser beam) illuminates the entire scene at once, and is then received at an array receiver that allows reconstructing the spatial information of the objects in the scene. In scanning LIDAR, the emitted light (e.g., a collimated laser beam) is directed to a single point at a time, and different portions of the scene are sequentially illuminated.

A scanning LIDAR system typically includes a scanning mirror that deflects the (e.g., laser) light to illuminate a target (e.g., an object). The light reflected from the target comes back to the LIDAR system and impinges onto a receiver. Using various post-processing techniques the LIDAR system obtains distance information to the target and may provide a two-dimensional (2D) depth image to reconstruct the scene by combining the data gathered from different scanning mirror locations. Various types of scanning mirror are available for use in a LIDAR system. One of the most promising technologies is based on the use of micro-electromechanical systems (MEMS) mirrors, which have multiple advantages in comparison to other types of (larger) mirrors, such as a reduced power consumption, a reduced footprint, lower cost, and the ability to scan in two dimensions.

BRIEF DESCRIPTION OF THE DRAWINGS

Throughout the drawings, like reference numbers are used to depict the same or similar elements, features, and structures. The drawings are not necessarily to scale, emphasis instead generally being placed upon illustrating aspects of the disclosure. In the following description, some aspects of the disclosure are described with reference to the following drawings, in which.

DESCRIPTION

Figure 1:
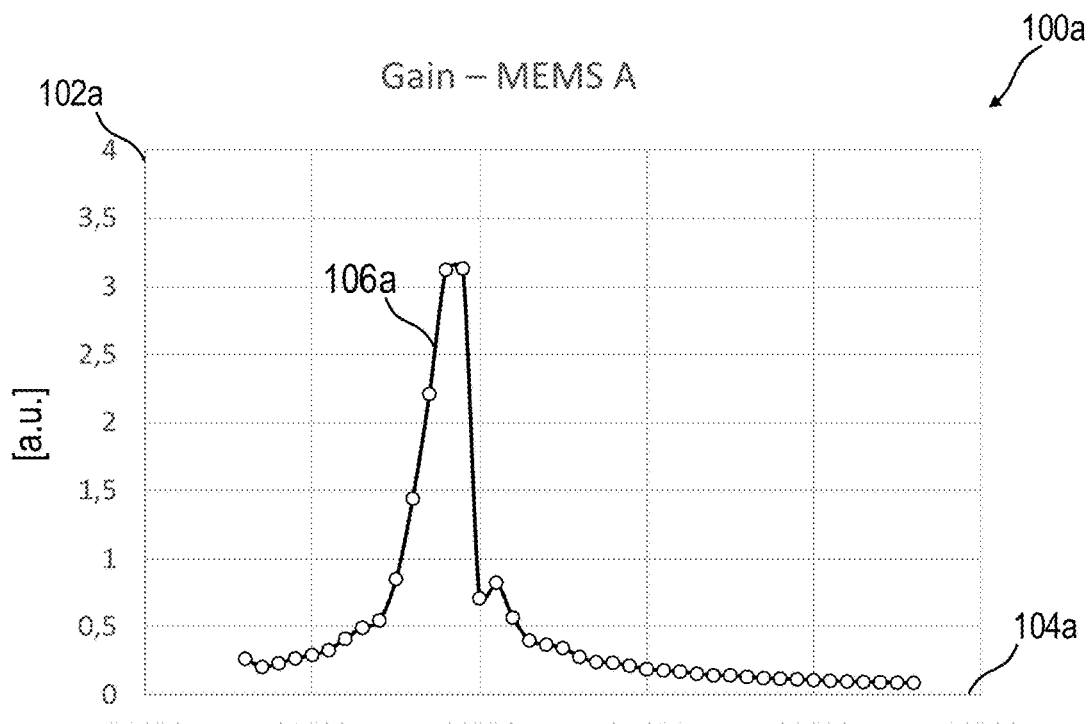
FIG. 1 exemplarily shows a first graph and a second graph illustrating the gain response of a first MEMS mirror and a second MEMS mirror, respectively.
Figure 1:
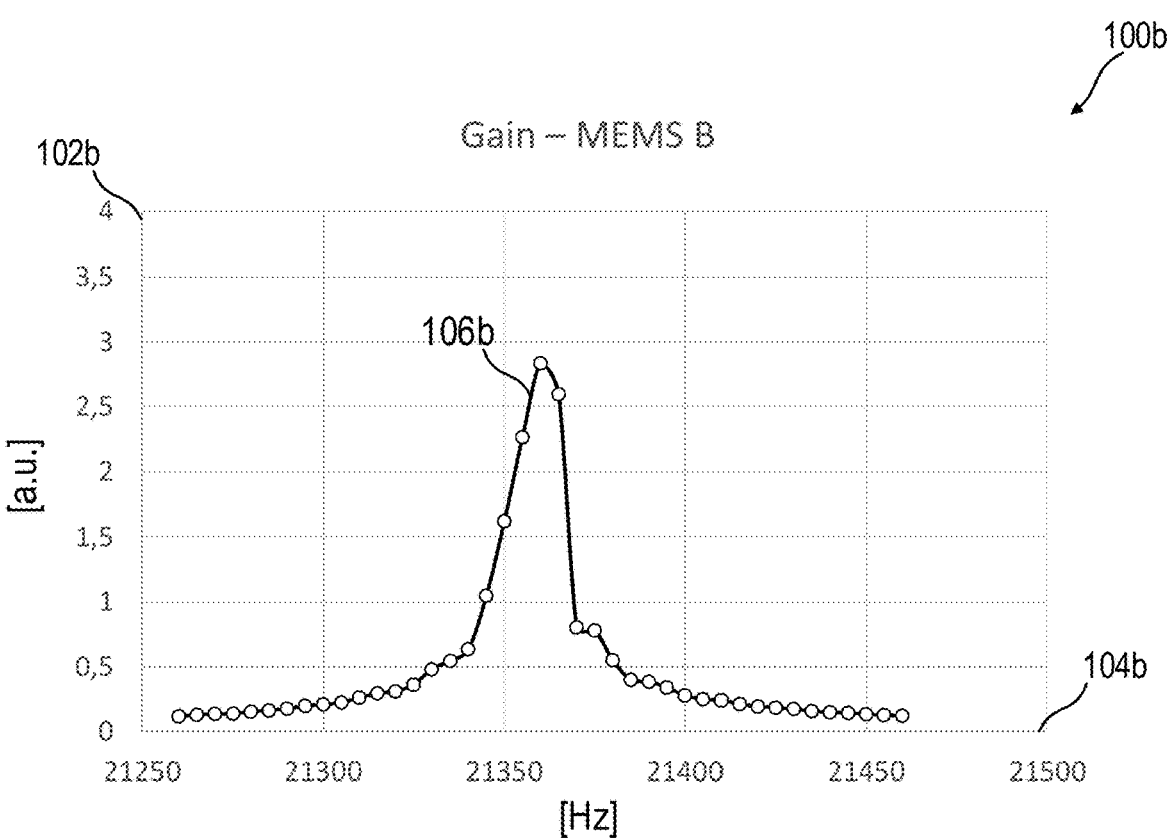

The following detailed description refers to the accompanying drawings that show, by way of illustration, specific details and aspects in which the disclosure may be practiced. One or more aspects are described in sufficient detail to enable those skilled in the art to practice the disclosure. Other aspects may be utilized and structural, logical, and electrical changes may be made without departing from the scope of the disclosure. The various aspects described herein are not necessarily mutually exclusive, as some aspects can be combined with one or more other aspects to form new aspects. Various aspects are described in connection with methods (e.g., a method of providing MEMS mirrors, a method of operating a LIDAR module) and various aspects are described in connection with devices (e.g., a LIDAR module, a driving circuit, a MEMS mirror). However, it may be understood that aspects described in connection with methods may similarly apply to the devices, and vice versa. Throughout the drawings, it should be noted that like reference numbers are used to depict the same or similar elements, features, and structures.

A LIDAR module may be understood as a device configured to implement LIDAR sensing, and may include various components to carry out light emission, light detection, and data processing. A LIDAR module may include a light source (e.g., a laser source) and emitter optics to direct light into a field of view (FOV) of the LIDAR module, and may include receiver optics and a receiver (a detector) to collect and detect light from the field of view. The LIDAR module may further include a processing circuit configured to determine spatial information associated with the field of view of the LIDAR module based on the emitted and received light (e.g., the processing circuit may be configured to determine various properties of an object in the field of view based on the light that the LIDAR module emits and that the object reflects back towards the LIDAR module). Additionally or alternatively, the LIDAR module may be communicatively coupled with a processing circuit external to the LIDAR module, e.g. with a cloud-based processing circuit. As examples, the processing circuit may be configured to determine the distance of an object from the LIDAR module, the shape of the object, the dimensions of the object, and/or the like. The LIDAR module may further include one or more additional components to enhance or assist the LIDAR sensing, such as, only as examples, a gyroscope, an accelerometer, a Global Positioning System (GPS) device, and/or the like. A LIDAR module may also be referred to herein as LIDAR device or LIDAR system.

A LIDAR module may have a range suitable for both indoor and/or outdoor applications and different operational ranges/resolutions, such as in the field of logistics (e.g., for warehouse management, e.g. to monitor inventory in a storage facility), robotics (e.g., for delivery robots, e.g. to assist the operation of a robotic arm), drones and unmanned aerial vehicles (UAVs), automotive (e.g., in the context of autonomous, partially autonomous or assisted driving), and/or security (e.g., to monitor the entrance/exit of a building), as examples. The LIDAR module may be a part of a component of a system or device (e.g., a LIDAR component in a vehicle, robot or handheld device such as a mobile phone, tablet, laptop or camera).

A LIDAR module may be configured according to a scanning configuration, in which the LIDAR module is configured to carry out a raster scan of the field of view by sequentially directing the emitted light towards different portions of the field of view. In the scanning configuration, the LIDAR module may include one or more components configured to control the emission direction of the light. For example, the LIDAR module may include one or more MEMS mirrors configured to deflect the light that a light source of the LIDAR module emits. Controlling an oscillation of the one or more MEMS mirrors may provide controlling a deflection angle of the light along one or two directions (e.g., a horizontal direction and/or a vertical direction) to direct the light towards a desired portion of the field of view and/or to scan the field of view.

For good outdoor performance of LIDAR sensing, it is desirable to minimize the collected ambient light (e.g., sunlight) and maximize the signal-to-noise ratio (SNR), thus increasing the (maximal) detection range of the LIDAR module.

Various conventional designs exist for implementing a LIDAR module, which however present some drawbacks in terms of SNR, detection range, and/or complexity of the system.

For example, in a so-called "wide field of view receiver" LIDAR, the receiver (RX) side sees the entire supported field of view all the time, and thus it collects a large amount of ambient light from all the possible directions supported by the device. As the laser emission power is limited by eye-safety limitations, the result is a reduction in SNR and an associated reduction in the detection range, even in presence of a low intensity (a low LUX) ambient illumination.

As another example, in a so-called "through-the-mirror" LIDAR, the transmitter (TX) side and the receiver (RX) side share a same optical path, which may lead to a reduction of the dynamic range of the system due to back-reflections from optical interfaces. A "through-the-mirror" LIDAR module may include expensive components, such as Faraday rotators, to redirect the RX illumination. Back-reflections into the laser source may cause laser instabilities. In non-coherent pulsed LIDAR technologies, the receiver may be typically gated in time to overcome this effect, however resulting in limitations on the minimal range. In time-spread coded LIDAR, the effect may be detrimental as even a portion of light as small as $10^{-8}$ back-reflected into the receiver can destroy the signal from a 20 m target.

As a further example, in a so-called "2D TX and 1D (slow) RX mirror" LIDAR, the transmitter side is scanning the field of view in two dimensions, and the receiver side is scanning in one dimension in synchronization with the slow, controlled direction of the TX mirror. In this design, the RX side collects the whole vertical FOV supported by the device. Although the ambient light problem is partly mitigated by screening out ambient light in the slow scanning direction, the fundamental problem described above in relation to the "wide field of view receiver" design still exists. Considering an exemplary scenario, assuming the supported resonant axis FOV is 60° and a collection angle of the slow axis is 4°, the collected solid angle is 0.07 steradians, which may still lead to the collection of a relatively large amount of ambient light.

As a further example, in a so-called "side-by-side scanning macro-mirror" LIDAR, the TX and RX are arranged in a side-by-side geometry, and a rotating macro-mirror deflects light into different directions during the scan. This design typically works for a single direction only, thus providing a line LIDAR. The orthogonal direction is usually sampled by a small number of laser lines pointing into slightly different directions. The sampling of the orthogonal axis creates a sparse depth image, which may provide insufficient data. In addition, the fact that the system relies on macro-mirrors results in a large form-factor, increased energy consumption, and potentially reliability issues.

The present disclosure is related to a LIDAR module adapted to reduce the amount of ambient light collected during the detection, thus providing an increased SNR and an increased detection range. The LIDAR module described herein may include a MEMS mirror at the transmitter side and a MEMS mirror at the receiver side, which operate in synchronization with one another (e.g., along two directions, for example in a resonant and a non-resonant axis). In the LIDAR module described herein, the receiver collection angle may be understood as a small cone that closely follows the direction of the transmitter MEMS mirror. The configuration described herein enables the RX channel to collect only light that comes from the direction determined by the transmitter, thus reducing the amount of ambient light that the LIDAR module collects.

The present disclosure is based on the realization that two MEMS mirrors may, in fact, be synchronized with one another on the resonant axis. A common misconception exists that two MEMS devices (e.g., two MEMS mirrors) that are operating in resonance cannot be operated in synchronization with one another. This misconception is related to the high Q-factor of the electro-mechanical resonance typical to MEMS, and specifically to MEMS mirrors (see FIG. 1), which leads to a very low probability for two random MEMS to have a same or similar resonant frequency (also referred to herein as resonance frequency). The present disclosure is based on the realization that MEMS mirrors fabricated on a same substrate (e.g., on a same wafer) have a narrow resonant frequency distribution (see FIG. 2A and FIG. 2B), so that it is possible to find and select on the substrate MEMS mirrors having substantially a same resonant frequency (e.g., resonant frequencies within a 10 Hz difference). Thus, the present disclosure is based on selecting MEMS mirror pairs (from a same batch, fabricated on a same substrate), in which MEMS mirrors having substantially a same resonant frequency may provide synchronized (and resonant) operation (e.g., for light emission and detection in a LIDAR module).

A method of providing MEMS mirrors (e.g., for use in a LIDAR module) may include: forming a plurality of MEMS mirrors on a substrate (e.g., on a semiconductor wafer); and determining a resonant frequency distribution of the plurality of MEMS mirrors to select one or more MEMS mirror pairs from the plurality of MEMS mirrors. The MEMS mirrors of a MEMS mirror pair have substantially a same resonant frequency.

A LIDAR module may include: a light detector configured to detect light, a first MEMS mirror, and a second MEMS mirror. One of the first MEMS mirror or the second MEMS mirror is configured to direct received light towards a field of view of the LIDAR module. The other one of the first MEMS mirror or the second MEMS mirror is configured to receive light from the field of view of the LIDAR module and to direct the light towards the light detector. The first MEMS mirror and the second MEMS mirror are configured to oscillate in synchronization with one another about a respective resonant axis and about a respective non-resonant axis (illustratively a respective fast axis and a respective slow axis). Additionally or alternatively, the first MEMS mirror and the second MEMS mirror may be configured to oscillate in synchronization with one another about two respective resonant axes.

A LIDAR module may include: a light detector configured to detect light, a first MEMS mirror, and a second MEMS mirror. One of the first MEMS mirror or the second MEMS mirror is configured to direct received light towards a field of view of the LIDAR module. The other one of the first MEMS mirror or the second MEMS mirror is configured to receive light from the field of view of the LIDAR module and to direct the light towards the light detector. The first MEMS mirror and the second MEMS mirror are configured to oscillate in synchronization with one another to cover a same angular range.

A LIDAR module may include: a light source configured to emit light, a light detector configured to detect light, a first MEMS mirror, and a second MEMS mirror. One of the first MEMS mirror or the second MEMS mirror is configured to receive the light that the light source emits, and to direct the light towards a field of view of the LIDAR module. The other one of the first MEMS mirror or the second MEMS mirror is configured to receive light from the field of view of the LIDAR module and to direct the light towards the light detector. The first MEMS mirror and the second MEMS mirror have substantially a same resonant frequency. The LIDAR module further includes a driving circuit configured to drive the first MEMS mirror and the second MEMS mirror in synchronization with one another based on the resonant frequency.

A method of operating a LIDAR module may be provided. The LIDAR module may include a first MEMS mirror and a second MEMS mirror. One of the first MEMS mirror or the second MEMS mirror is configured to direct received light towards a field of view of the LIDAR module and the other one of the first MEMS mirror or the second MEMS mirror is configured to receive light from the field of view of the LIDAR module (e.g., to direct it towards a detector of the LIDAR module). The method may include controlling an oscillation of the first MEMS mirror and of the second MEMS mirror (e.g., an oscillation about a respective resonant axis and/or about a respective non-resonant axis) in synchronization with one another to cover a same angular range.

A method of operating a LIDAR module may be provided. The method may include: driving an oscillation of a first MEMS mirror and a second MEMS mirror about a respective fast axis at a same fast driving frequency, and driving an oscillation of the first MEMS mirror and the second MEMS mirror about a respective slow axis at a same slow driving frequency. The fast driving frequency corresponds to the resonant frequency of at least one of the first MEMS mirror and/or the second MEMS mirror. The slow driving frequency may be less than the resonant frequency.

The first MEMS mirror and the second MEMS mirror being configured to oscillate in synchronization with one another may be understood as the first MEMS mirror and the second MEMS mirror being configured to allow an oscillation in synchronization with one another (e.g., about respective resonant and/or non-resonant axis, e.g. to cover a same angular range). Illustratively, the first MEMS mirror and the second MEMS mirror may have properties (e.g., structural and mechanical properties) that allow controlling a respective oscillation of the first MEMS mirror and the second MEMS mirror in synchronization with one another. Even in the case that differences in the properties of the MEMS mirrors are present (e.g., a slight difference in the respective resonant frequencies, for example a difference equal to or less than 10 Hz), the differences may be such that an oscillation of the first MEMS mirror and the second MEMS may still occur in synchronization (e.g., about respective resonant and/or non-resonant axis, e.g. to cover a same angular range).

Further illustratively, the first MEMS mirror and the second MEMS mirror being configured to oscillate in synchronization with one another may include the first MEMS mirror and the second MEMS mirror being configured to allow a control (e.g., a driving) of a respective oscillation (e.g., about the respective resonant axis) at a same driving frequency. The first MEMS mirror and the second MEMS mirror may be configured to allow a respective oscillation with a same oscillation frequency (e.g., about the respective resonant axis) to cover a same angular range. For controlling the oscillation of the MEMS mirrors about the respective resonant axis, the driving frequency may correspond to the resonant frequency of at least one of the first MEMS mirror and/or the second MEMS mirror. Illustratively, the driving frequency, which is same for both the first MEMS mirror and the second MEMS mirror, may correspond to the resonant frequency of both MEMS mirrors in the case that the MEMS mirrors have a same resonant frequency, or may correspond to the resonant frequency of one of the MEMS mirrors in the case that the MEMS mirrors have slightly different resonant frequencies (within a difference range that allows the synchronized oscillation).

In the present disclosure, the use of MEMS mirrors operating in synchronization with one another may be described in relation to LIDAR applications, e.g. in relation to the use of the MEMS mirrors in a LIDAR module. It is however understood that the use of MEMS mirrors oscillating in synchronization with one another (while operating in resonant mode) is not limited to LIDAR applications, and MEMS mirrors as described herein may be for use also in other types of modules or operations.

A MEMS mirror may be understood as an opto-mechanical beam steering device. The general structure and configuration of a MEMS mirror are known in the art, and a brief description is provided herein to illustrate the aspects of the present disclosure. A MEMS mirror may include a mirror surface (e.g., a polished surface with a reflective coating) mounted on supporting bars (also referred to as linkages, or rotators) that allow a torsion and/or a (partial) rotation to control a tilting angle of the mirror surface. A MEMS mirror may be configured as a bi-axial MEMS structure to allow beam steering in two directions. In this configuration, the mirror surface may be mounted on four supporting bars (illustratively, two bi-axial supporting bars), e.g. a first pair of supporting bars defining a first axis of the MEMS mirror and a second pair of supporting bars defining a second axis of the MEMS mirror. Illustratively, the first axis and the second axis may be perpendicular to one another, and define a plane parallel to the mirror surface of the MEMS mirror. The first axis and the second axis may be the axes about which the MEMS mirror may oscillate. The control of the beam steering of light incident onto the MEMS mirror (illustratively, the control of the deflection angle of the light) may include controlling the tilting angle of the mirror surface with respect to the first axis and/or with respect to the second axis. A MEMS mirror may also be referred to as micro-mirror, micro-scanner, or micro-scanning mirror.

Various actuation mechanisms exist for driving a MEMS mirror, e.g. electrostatic actuation, electromagnetic actuation, piezoelectric actuation, and thermal actuation. Considering electromagnetic actuation, as an example, a driving signal (e.g., a driving current, or a driving voltage) may generate a magnetic field that drives the oscillation of the MEMS mirror about one or both of its first axis and/or second axis. An oscillation of the MEMS mirror may be understood as an oscillation (illustratively, a tilting) of the mirror surface. A frequency of the driving signal (e.g., a frequency of a time-varying current or voltage, for example an oscillation frequency of a sinusoidal current or voltage) may define a frequency of the oscillation of the MEMS mirror. In the following, various examples may be described in relation to an electromagnetic actuation of a MEMS mirror; it is however understood that the aspects described herein may apply in a corresponding manner also to other types of actuation mechanisms.

A MEMS mirror may have different operation modes associated with different oscillation frequencies of the MEMS mirror. In a resonant mode, the oscillation of the MEMS mirror may have a frequency corresponding to the resonant frequency of the MEMS mirror (illustratively, the resonant frequency may be the natural frequency of the MEMS mirror at which the MEMS mirror tends to oscillate with a greater amplitude). The axis (or axes) about which the MEMS mirror oscillates at the resonant frequency may be referred to as resonant axis or fast axis. An oscillation at the resonant frequency may provide a greater oscillation amplitude (a greater tilting angle, and thus a greater deflection angle) compared to an oscillation not at the resonant frequency (e.g., an oscillation at the resonant frequency may provide a greater oscillation amplitude at a lower driving voltage compared to an oscillation not at the resonant frequency). Illustratively, in resonant mode, a non-linear relationship exists between the amplitude of the driving signal and the oscillation amplitude. In the context of a LIDAR module, oscillation at the resonant frequency may provide scanning a greater angular range of the field of view. An oscillation at the resonant frequency may include an oscillation at a frequency in a range around the resonant frequency (illustratively, a frequency near the resonant frequency), e.g. in a range of ±30 Hz around the resonant frequency, e.g. in a range of ±10 Hz around the resonant frequency. In a non-resonant (quasi-static) mode, the oscillation of the MEMS mirror may have a frequency less than the resonant frequency of the MEMS mirror (as a numerical example, the frequency may be less than one-fifth of the resonant frequency, or less than one-tenth of the resonant frequency). The axis (or axes) about which the MEMS mirror oscillates at the frequency less than the resonant frequency may be referred to as non-resonant axis or slow axis. In the non-resonant mode, a linear relationship exists between the amplitude of the driving signal and the oscillation amplitude. A MEMS mirror configured for two-dimensional beam steering may thus have at least three operation modes: a first (resonant) mode in which the oscillation about both axes is at the resonant frequency, a second (non-resonant) mode in which the oscillation about both axes is at a frequency less than the resonant frequency, and a third (mixed) operation mode in which the oscillation about one (fast) axis is at the resonant frequency and the oscillation about the other (slow) axis is at a frequency less than the resonant frequency.

FIG. 1 exemplarily shows a first graph 100a and a second graph 100b illustrating the gain response of a first MEMS mirror and a second MEMS mirror, respectively. The graphs 100a, 100b show the gain of the MEMS mirror (along the vertical axis 102a, 102b, in arbitrary units) as a function of the frequency at which the MEMS mirror operates (along the horizontal axis 104a, 104b in Hertz, Hz). The gain response may be representative of an oscillation amplitude of the MEMS mirror as a function of the frequency. Illustratively, the gain response may be representative of the force to drive the MEMS mirror as a function of frequency, and may show that for a frequency near to or at the resonant frequency the force to drive the MEMS mirror may become lower compared to a frequency not near to or not at the resonant frequency. The gain response may show that the oscillation amplitude has a peak in correspondence of the resonant frequency of the MEMS mirror.

The graphs 100a, 100b may represent the resonant axis spectral scan of two randomly selected MEMS mirrors. In the graphs 100a, 100b, the resonant frequency of the first MEMS mirror (MEMS A) is 21540 Hz and the resonant frequency of the second MEMS mirror (MEMS B) is 21370 Hz. At the respective resonant frequency, the gain of the MEMS mirror may have peak, illustratively a respective maximum value. In the graphs 100a, 100b the 3 dB bandwidth of the resonance (illustratively, the frequency range at which the gain is about half of the maximum gain) is about 20 Hz. From these exemplary values it may be determined that a MEMS mirror may have a high quality factor Q (e.g., calculated as the ratio between the resonant frequency and the bandwidth of the resonance), e.g. in a range from 50 to 1000, for example in a range from 100 to 500.

From the graphs 100a, 100b it may be understood that there is a very low probability for two randomly selected MEMS mirrors to have a same or similar resonant frequency (e.g., within a 10 Hz difference). For the exemplary scenario of the first MEMS mirror and the second MEMS mirror in FIG. 1, the probability may be p=10 Hz/(21540 Hz−21370 Hz), which is less than 6%, assuming a uniform distribution between the two presented spectra 106a, 106b.

The graphs 100a, 100b illustrate thus a reason behind the common misconception that two MEMS cannot be synchronized on the resonant axis (illustratively, the misconception that two MEMS mirrors cannot oscillate at the respective resonant frequency in synchronization with one another). Such misconception may be related to the very low probability of finding (at random) MEMS mirrors that have a same (or substantially same) resonant frequency, as described above.

The present disclosure may be based on the realization that it is, in fact, possible to reliably and reproducibly find and select MEMS mirrors having a same or substantially same resonant frequency. This may open the possibility of designing systems in which different MEMS mirrors oscillating at the respective resonant frequency may oscillate in synchronization with one another. This may provide achieving greater oscillation amplitudes (and thus greater deflection angles) with a reduced power consumption, while ensuring a synchronized operation. In a LIDAR module, as described in further detail below, the synchronized operation of a MEMS mirror at the transmitter side and a MEMS mirror at the receiver side may provide an increase in the SNR (and thus in the detection range).

As described herein, two MEMS mirrors may be considered to have a same resonant frequency or a substantially same resonant frequency in the case that a difference (illustratively, an absolute value of a difference) between a first resonant frequency of a first MEMS mirror of the two MEMS mirrors and a second resonant frequency of a second MEMS mirror of the two MEMS mirrors allows controlling an oscillation of the two MEMS mirrors in synchronization with one another about the respective resonant axis. As a numerical example, two MEMS mirrors may be considered to have a same resonant frequency or a substantially same resonant frequency in the case that a difference between the first resonant frequency and the second resonant frequency is in a range from 0 Hz to 10 Hz, for example in a range from 0 Hz and 5 Hz. As another numerical example, two MEMS mirrors may be considered to have a same resonant frequency or a substantially same resonant frequency in the case that a percentage difference between the first resonant frequency of the first MEMS mirror and the second resonant frequency of the second MEMS mirror is in a range from 0% to 3%, for example in a range from 0% to 1%. The percentage difference may be calculated by dividing the absolute value of the difference between the frequencies for the half of the sum of the frequencies.

Figure 2A:
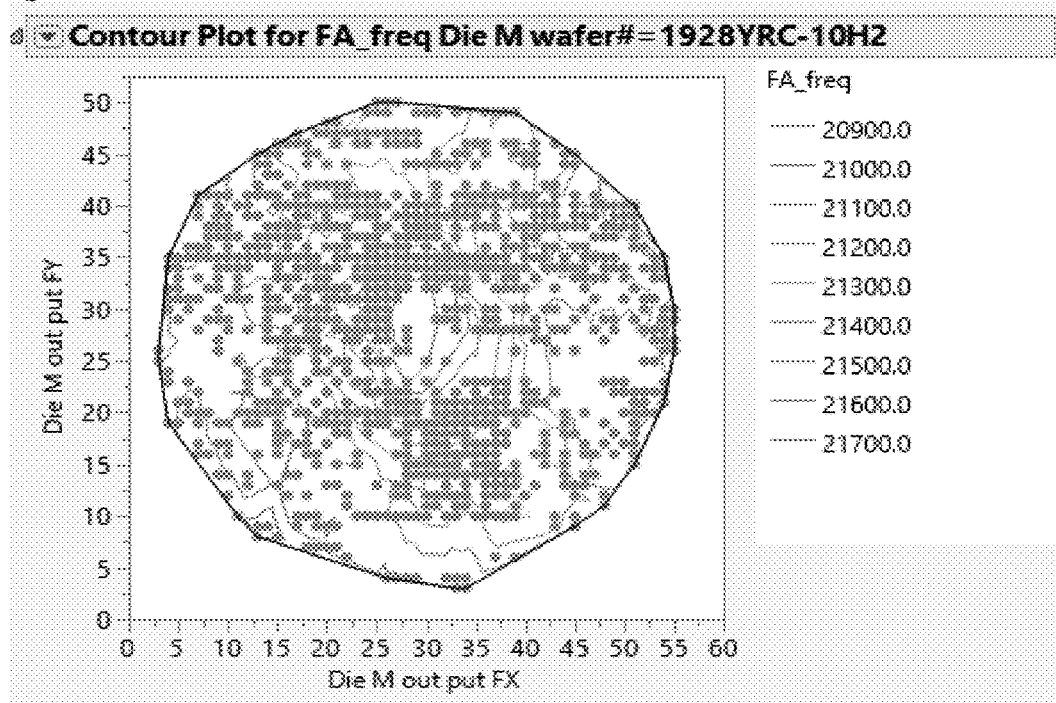
FIG. 2A exemplarily shows a first contour plot and a second contour plot illustrating the distribution of resonant frequencies of MEMS mirrors fabricated on a first substrate and on a second substrate, respectively.
Figure 2A:
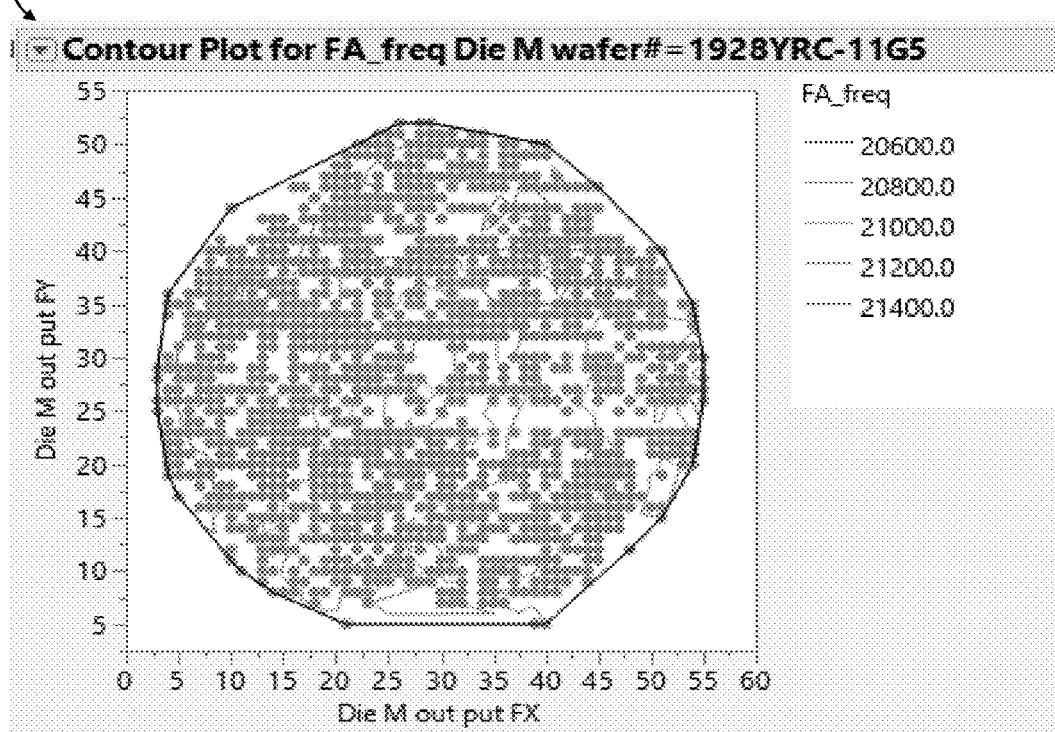

FIG. 2A exemplarily shows a first contour plot 200a and a second contour plot 200b illustrating the distribution of resonant frequencies of MEMS mirrors fabricated on a first substrate (e.g., a first wafer) and on a second substrate (e.g., a second wafer), respectively. The contour plots 200a, 200b show the resonant frequency with respect to substrate location for two randomly selected substrates (e.g., two randomly selected wafers).

When observing the resonant frequency of MEMS mirrors fabricated on a single substrate (e.g., on a single wafer) the situation looks different with respect to randomly selected MEMS mirrors. As shown in the contour plots 200a, 200b in FIG. 2A it was found that there is a high spatial correlation in resonant frequency across substrate location (e.g., wafer location). Illustratively, it was found that MEMS mirrors fabricated on adjacent portions of the substrate may have a same or substantially same resonant frequency. There may be a dome-shaped correlation between the position of the MEMS mirrors on the substrate and the resonant frequency. Thus it may be possible to select "twin" MEMS mirrors (illustratively, MEMS mirrors with a resonant frequency difference less than 10 Hz, or less than 5 Hz), for example by sorting resonant frequency data for a same substrate (e.g., data available a priori based on vendor outgoing quality control, OQC, data).

Although the average resonant frequency per substrate is different (about 300 Hz difference), the shape of the function associating the resonant frequency with the substrate location is similar across different substrates. This indicates that such function may be process related. As a result, it was found that a high spatial correlation exists between MEMS mirrors in the same substrate, and higher chance to match "twin" MEMS pairs on a single substrate than across multiple substrates.

Figure 2B:
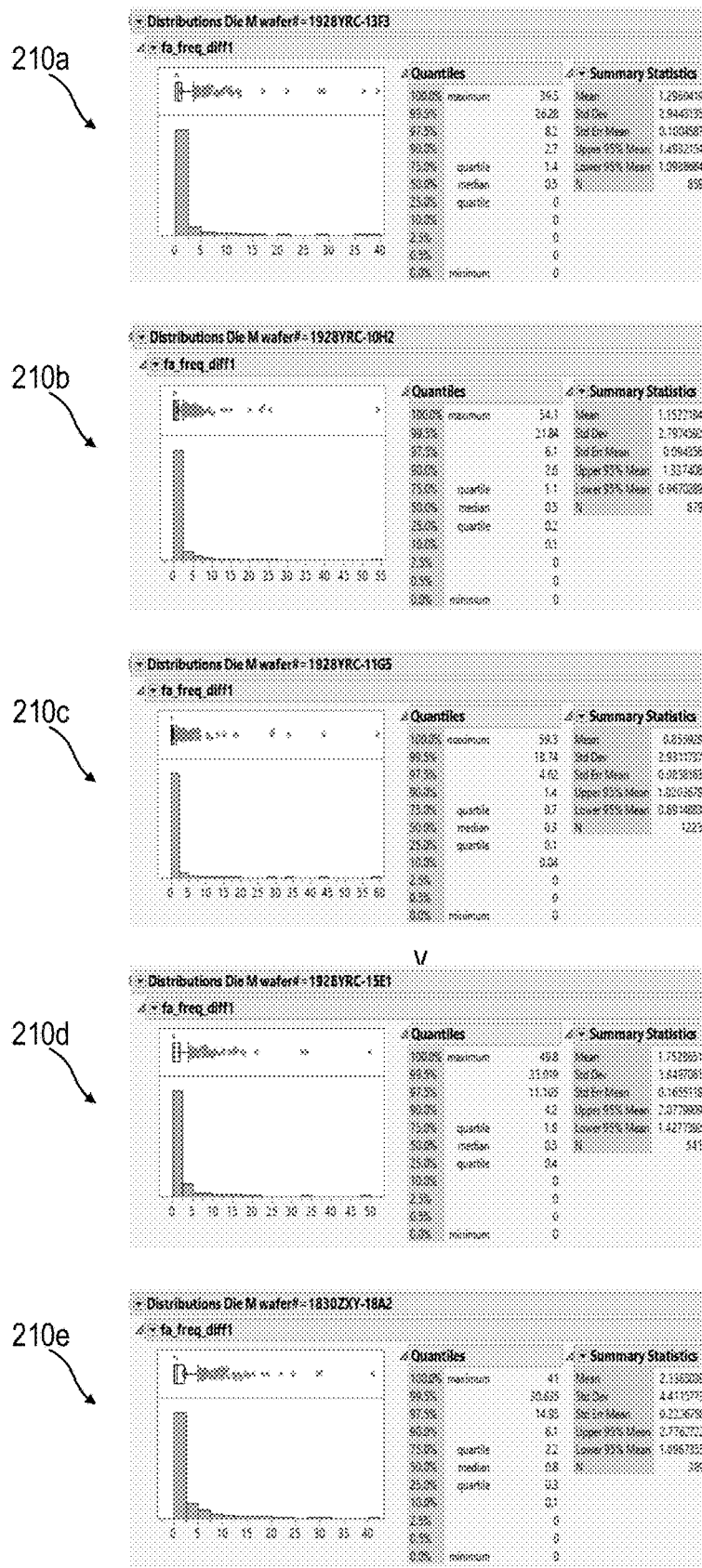
FIG. 2B exemplarily shows histograms describing the distribution of resonant frequencies of MEMS mirrors fabricated on different substrates.

FIG. 2B exemplarily shows histograms 210a, 210b, 210c, 210d, 210e describing the distribution of resonant frequencies of MEMS mirrors fabricated on different substrates (e.g., on five different wafers).

The histograms 210a, 210b, 210c, 210d, 210e in FIG. 2B show the distribution of the optimally selected MEMS pairs (also referred to herein as "twin" MEMS) resonant frequency absolute difference (in FIG. 2B indicated as fa_freq_diff1) per substrate. Across the majority of the presented randomly selected substrates, the 97.5% quantile shows that it is possible to find MEMS mirrors having a less than 8 Hz difference in the resonant frequencies, while in average the 97.5% quantile shows that it is possible to find MEMS mirrors having a less than 10 Hz difference in the resonant frequencies. It may thus be possible to select "twin" MEMS mirrors with a 97% yield from a same substrate, as the data in FIG. 2B across different substrates show.

It is understood that the values (e.g., the resonant frequency values, the distribution, the percentiles) shown and described in relation to FIG. 2A and FIG. 2B are exemplary, to illustrate aspects relevant for the present disclosure, and other values (e.g., other resonant frequency values, other distributions, other percentiles, etc.) may be possible.

An important observation related to the present disclosure is thus that, assuming the supply chain of the MEMS mirrors is controlled at the substrate-level (e.g., at the wafer-level), it may be possible to match "twin" MEMS dies, which may provide the possibility of selecting two MEMS mirrors that may oscillate in synchronization with one another at the resonant frequency.

Figure 3:
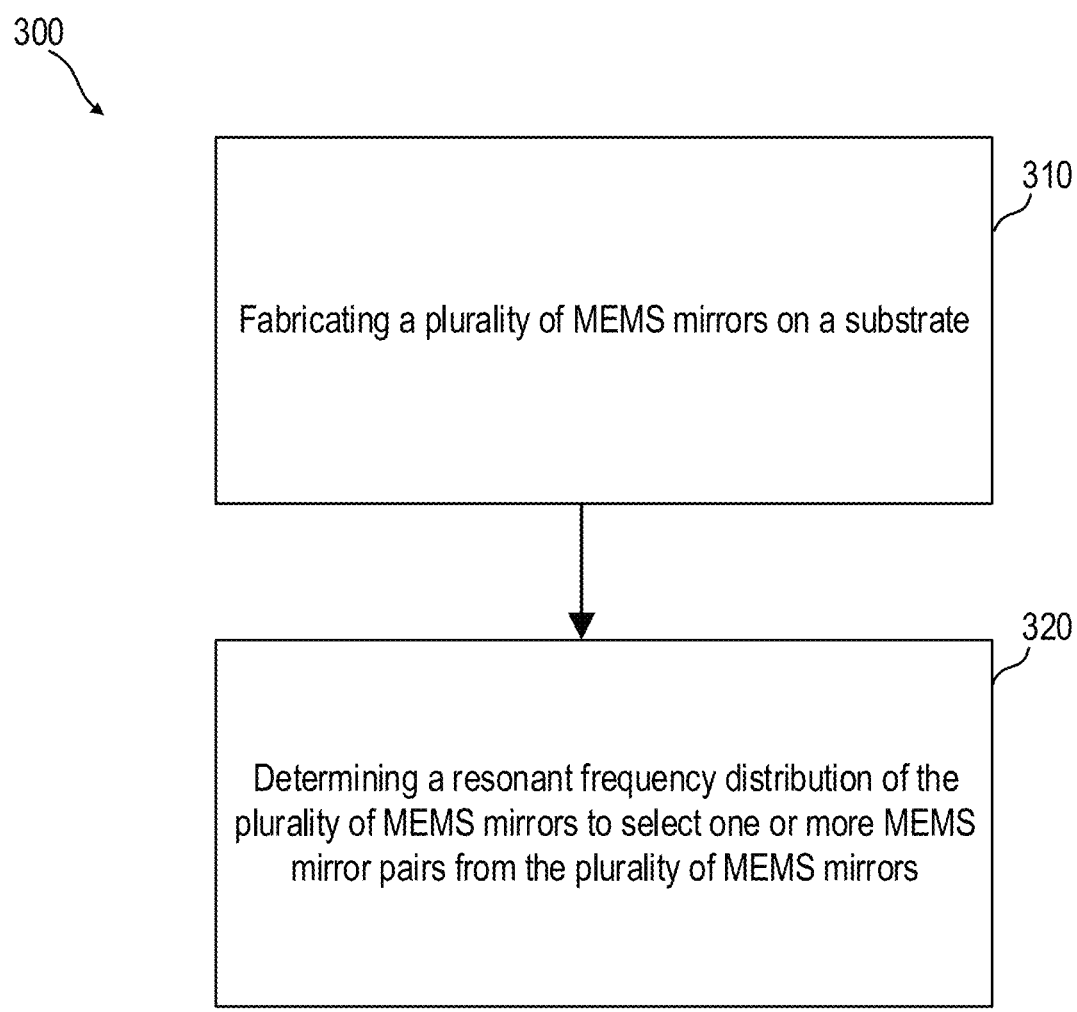
FIG. 3 exemplarily shows a schematic flow diagram of a method of providing MEMS mirrors.

FIG. 3 exemplarily shows a flow diagram of a method 300 of providing MEMS mirrors (e.g., for use in a LIDAR module). The method 300 may be understood as a method of fabricating and selecting MEMS mirrors (e.g., for use in a LIDAR module).

The method 300 may include, in 310, fabricating (in other words, forming) a plurality of MEMS mirrors on a substrate. The fabrication of the plurality of MEMS mirrors may include standard MEMS fabrication techniques, as known in the art. The substrate may be or may include a semiconductor wafer, such as a silicon wafer (e.g., including single-crystal silicon). Only as an example, considering a silicon wafer as substrate, the fabrication of the plurality of MEMS mirrors may include: a thermal oxidation of the surface of the silicon wafer to provide a thin silicon dioxide layer (e.g., with a thickness of about 1 mm); a deposition of a top layer including silicon (e.g., a silicon nitride layer) on the silicon dioxide layer; a coating of the top layer with a photoresist (e.g., a resist polymer) and a patterning of the photoresist layer; an etching of the silicon wafer from the top side (through the patterned photoresist layer) to provide a desired pattern for the top side of the MEMS mirror; removal of the residual photoresist layer; a further coating of a bottom surface of the silicon wafer with a further photoresist layer and a further etching of the silicon wafer from the bottom side (through the patterned further photoresist layer) to provide a desired structure for the bottom side of the MEMS mirror; removal of the residual further photoresist layer; a further etching step for etching the silicon dioxide layer to provide a suspended structure for the MEMS mirror; and a deposition of a highly reflective material to provide the mirror surface of the MEMS mirror (e.g., a metal deposition, for example a deposition of aluminum or gold). It is understood that the fabrication process described herein is exemplary, and other fabrication processes for fabricating MEMS mirrors on a substrate may be provided (e.g., with additional, less, or alternative fabrication steps), as long as controlled fabrication conditions for the MEMS mirrors may be ensured.

A MEMS mirror of the plurality of MEMS mirrors may have a mirror surface having a regular shape, such as a circular shape, a rectangular shape, or a square shape. Only as a numerical example, a MEMS mirror of the plurality of MEMS mirrors may have a lateral dimension (e.g., a diameter in the case of a circular mirror surface, or a side in the case of a square or rectangular mirror surface) in the range from 0.5 mm to 10 mm, for example in the range from 1 mm to 5 mm. It is understood that the shapes and dimensions described herein are exemplary, and a MEMS mirror may have other suitable shapes and/or dimensions, e.g. in accordance with a desired use of the MEMS mirror.

The method 300 may further include, in 320, determining a resonant frequency distribution of the plurality of MEMS mirrors to select one or more MEMS mirror pairs from the plurality of MEMS mirrors. A resonant frequency distribution may be understood as a function showing a correspondence between a resonant frequency of a MEMS mirror and its location on the substrate (as described in relation to FIG. 2A). Illustratively, the resonant frequency distribution may include a correlation between a position on the substrate of a MEMS mirror of the plurality of MEMS mirrors and the respective resonant frequency. The resonant frequency distribution may be or may include a contour plot of the resonant frequencies with respect to the location on the substrate (as described in relation to FIG. 2A). The MEMS mirrors of a MEMS mirror pair may substantially have a same resonant frequency. Illustratively, the method 300 may include determining the individual resonant frequencies of the MEMS mirrors of the plurality of MEMS mirrors and selecting one or more MEMS mirror pairs including MEMS mirrors that substantially have a same resonant frequency.

The method 300 may optionally include one or more further aspects, described in further detail below, which may be adapted in accordance with a desired use of the selected MEMS mirror pairs.

As an example, the method 300 may include picking the MEMS mirrors of at least one MEMS mirror pair of the one or more MEMS mirror pairs. Illustratively, the method 300 may include extracting (in other words, taking) the MEMS mirrors of a MEMS mirror pair from the plurality of MEMS mirrors. The method 300 may further include placing (in other words, arranging or disposing) the (picked) MEMS mirrors of a MEMS mirror pair into a device (e.g., in a LIDAR module). For example, the MEMS mirrors of each MEMS mirror pair may be disposed in a respective device, e.g. in a respective LIDAR module.

As a further example, the method 300 may include configuring the MEMS mirrors of at least one MEMS mirror pair for a desired use. The method 300 may include, in the context of LIDAR applications, calibrating the MEMS mirrors of at least one MEMS mirror pair to configure one of the MEMS mirrors of the MEMS mirror pair as a transmitting mirror for a LIDAR module (illustratively, as MEMS mirror for use in the transmitter side of the LIDAR module) and to configure the other one of the MEMS mirrors as a receiving mirror for the LIDAR module (illustratively, as MEMS mirror for use in the receiver side of the LIDAR module). The calibration may include, for example, synchronizing an oscillation of the MEMS mirrors with a frame rate of the LIDAR module, e.g. synchronizing the transmitting mirror with a pulse rate of a light source of the LIDAR module and the receiving mirror with an acquisition rate of a receiver of the LIDAR module. As a further example, the calibration may include adjusting an orientation of the transmitting mirror with respect to the light source of the LIDAR module, and/or adjusting an orientation of the receiving mirror with respect to the receiver of the LIDAR module. It is understood that the calibration may include additional or alternative aspects with respect to those described herein, e.g. to ensure a desired operation of the MEMS mirrors in the LIDAR module.

In the following, e.g. in relation to FIG. 4A to FIG. 6, the operation of MEMS mirrors oscillating in synchronization with one another will be described in the context of a LIDAR module. It is however understood that MEMS mirrors capable of oscillating in synchronization with one another may be for use also in other types of applications or modules.

Figure 4A:
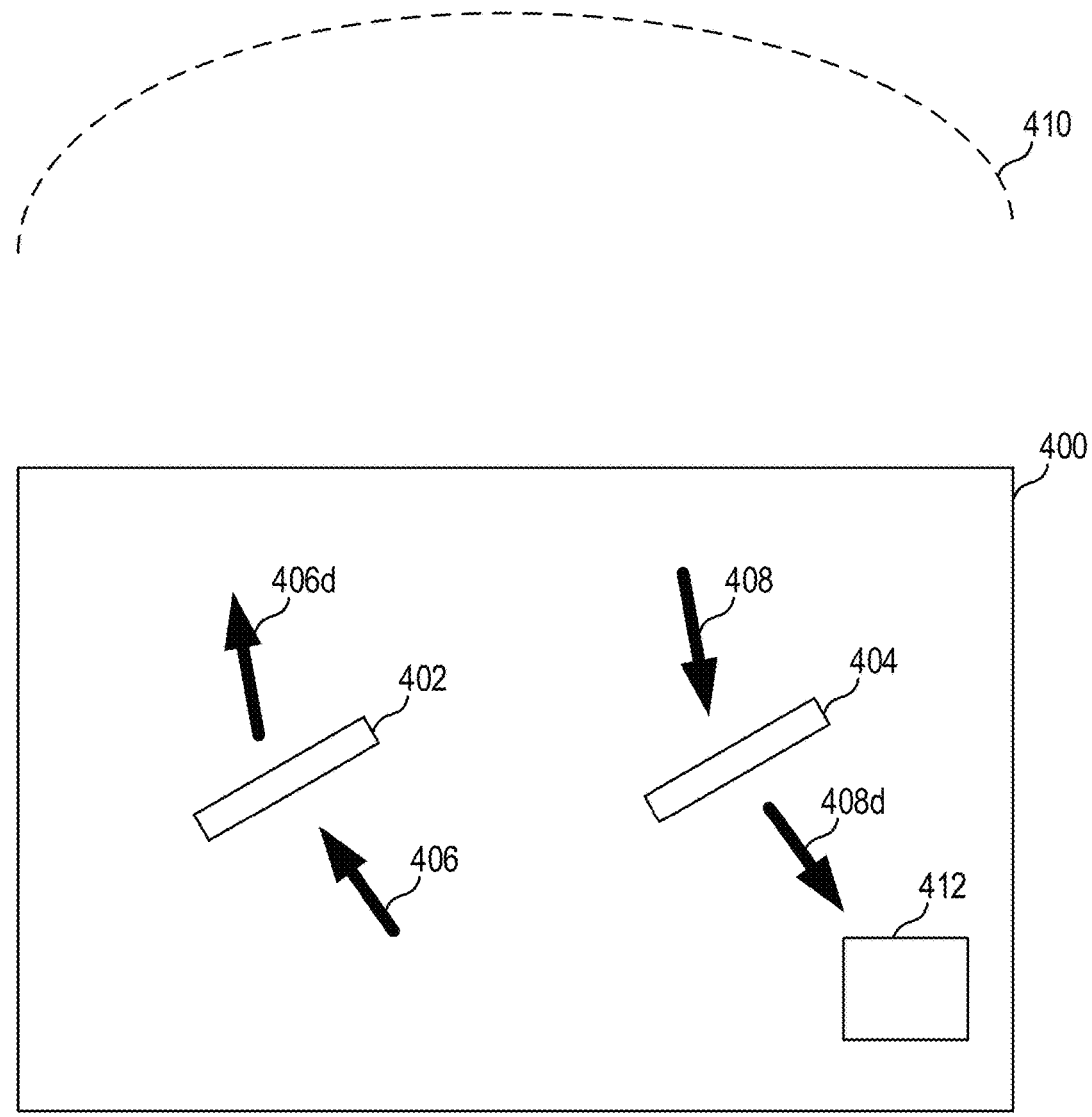
FIG. 4A and FIG. 4B each exemplarily shows a LIDAR module in a schematic top view.
Figure 4A:
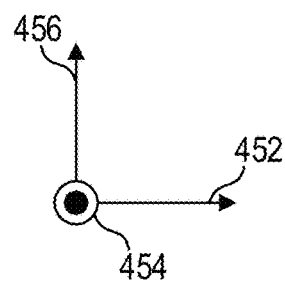

FIG. 4A exemplarily shows a LIDAR module 400 in a schematic top view. It is understood that the representation of the LIDAR module 400 may be simplified for the purpose of illustration, and that the LIDAR module 400 may include additional components with respect to those shown (see also FIG. 4B). The LIDAR module 400 may be configured for time-of-flight LIDAR detection or for Frequency Modulated Continuous Wave (FMCW) LIDAR detection, as described in further detail below.

The LIDAR module 400 may include a plurality of MEMS mirrors, e.g. one or more MEMS mirrors at the transmitter side and one or more MEMS mirrors at the receiver side. In the exemplary configuration in FIG. 4A and FIG. 4B, the LIDAR module 400 may include a first MEMS mirror 402 and a second MEMS mirror 404 (illustratively, a MEMS mirror pair). The first MEMS mirror 402 may be disposed at the transmitter side of the LIDAR module 400, and the second MEMS mirror 404 may be disposed at the receiver side of the LIDAR module 400. It is understood that the LIDAR module 400 may include more than one MEMS mirror pair.

One of the first MEMS mirror 402 or the second MEMS mirror 404 (e.g., the first MEMS mirror 402 in the exemplary configuration in FIG. 4A and FIG. 4B) may be configured to direct light towards a field of view 410 of the LIDAR module 400. In the exemplary configuration in FIG. 4A, the first MEMS mirror 402 may be configured to receive light 406 and to direct (e.g., to deflect) the received light 406 (as deflected light 406d) towards the field of view 410 of the LIDAR module 400. Illustratively, the first MEMS mirror 402 may be configured (e.g., controlled) to deflect light 406 to scan the field of view 410 (illustratively, to sequentially deflect the light 406 at different deflection angles to illuminate different portions of the field of view 410).

The other one of the first MEMS mirror 402 or the second MEMS mirror 404 (e.g., the second MEMS mirror 404 in the exemplary configuration in FIG. 4A and FIG. 4B) may be configured to receive light 408 from the field of view 410 of the LIDAR module 400, and to direct the light towards a light detector 412 of the LIDAR module 400. The light detector 412 may be configured to detect light (e.g., to generate a signal upon light impinging onto the detector), as described in further detail below. The light detector 412 may also be referred to herein simply as detector or receiver. In the exemplary configuration in FIG. 4A, the second MEMS mirror 404 may be configured to receive light 408 and to direct (e.g., to deflect) the received light 408 (as deflected light 408d) towards the light detector 412.

The first MEMS mirror 402 and the second MEMS mirror 404 may be configured to oscillate in synchronization with one another to cover a same angular range. The first MEMS mirror 402 and the second MEMS mirror 404 may be configured to oscillate (at least) about a respective resonant axis in synchronization with one another. As an example, the first MEMS mirror 402 and the second MEMS mirror 404 may be configured to oscillate about two respective resonant axes in synchronization with one another. As another example, the first MEMS mirror 402 and the second MEMS mirror 404 may be configured to oscillate about a respective resonant axis and about a respective non-resonant axis in synchronization with one another. Only as an example, the resonant axis may be the respective first axis of the MEMS mirrors 402, 404 and the non-resonant axis may be the respective second axis of the MEMS mirrors 402, 404. An oscillation in synchronization with one another to cover the same angular range may be implemented by the first MEMS mirror 402 and the second MEMS mirror being directed towards a same portion (e.g., facing a same angular portion, for example within a difference of ±2°, for example within a difference of ±1°) of the field of view 410 (to direct light thereto or to receive light therefrom) substantially at the same time. Illustratively, an oscillation in synchronization with one another may include a first tilting angle of the first MEMS mirror 402 and a second tilting angle of the second MEMS mirror 404 (e.g., about the respective resonant and/or non-resonant axis) substantially having a same behavior over time (e.g., varying over time substantially in a same manner).

The first MEMS mirror 402 and the second MEMS mirror 404 may substantially have a same resonant frequency, e.g. a difference between a first resonant frequency of the first MEMS mirror 402 and a second resonant frequency of the second MEMS mirror 404 may be in the range from 0 Hz to 10 Hz, for example in the range from 0 Hz to 5 Hz. The first MEMS mirror 402 and the second MEMS mirror 404 may be configured to oscillate about at least one respective axis at the respective (same or substantially same) resonant frequency in synchronization with one another. As an example, the first MEMS mirror 402 and the second MEMS mirror 404 may be configured to oscillate about the respective two axes at the resonant frequency. As another example, the first MEMS mirror 402 and the second MEMS mirror 404 may be configured to oscillate about one axis at the resonant frequency and about the other axis at a frequency less than the resonant frequency, as described in further detail below.

Only as a numerical example, the resonant frequency of the first MEMS mirror 402 and/or of the second MEMS mirror 404 may be in the range from 1 kHz to 50 kHz, for example in the range from 5 kHz to 40 kHz, for example in the range from 15 kHz to 30 kHz.

For example, the first MEMS mirror 402 and the second MEMS mirror 404 may be selected from a plurality of MEMS mirrors formed on a same substrate (e.g., as described in relation to the method 300 in FIG. 3). Illustratively, the first MEMS mirror 402 and the second MEMS mirror 404 may have been fabricated on a same substrate (e.g., according to the method 300 described in FIG. 3), and selected as a MEMS mirror pair having a same or substantially same resonant frequency.

The synchronized oscillation of the first MEMS mirror 402 and the second MEMS mirror 404 may provide that the collection of light from the field of view follows the emission of light into the field of view, so that substantially only the light that the LIDAR module 400 emits is collected (and directed towards the detector 412). This may ensure that an amount of ambient light that the LIDAR module 400 collects is reduced, thus providing an increase in the SNR (and in the detection range).

The field of view 410 may be understood as the angular extent that the LIDAR module 400 may cover, e.g. the angular extent that the LIDAR module 400 may illuminate and from which the LIDAR module 400 may receive/detect light. From the perspective of the LIDAR module 400, the field of view 410 may have a first angular extension in a first field of view direction (e.g., along the first direction 452 in FIG. 4A and FIG. 4B), e.g. the horizontal direction, and a second angular extension in a second field of view direction (e.g., along the second direction 454), e.g. the vertical direction (illustratively coming out from the page in FIG. 4A and FIG. 4B). The depth of the field of view 410 (along the third direction 456) may be associated with the (maximum) detection range of the LIDAR module 400. The third direction 456 may be along an optical axis of the LIDAR module 400 (not shown), and the first direction 452 and the second direction 454 may define a plane perpendicular to the third direction 456.

The angular range that the first MEMS mirror 402 and the second MEMS mirror 404 cover may include a first angular range along the first field of view direction (e.g., the horizontal direction) and a second angular range along the second field of view direction (e.g., the vertical direction). The angular range along a certain direction may be associated with an oscillation of the MEMS mirrors 402, 404. The extent of the angular range that the MEMS mirrors 402, 404 cover in a certain direction may be associated with the oscillation frequency about the corresponding axis. Illustratively, an oscillation of the MEMS mirrors 402, 404 to cover a same angular range may include an oscillation of the MEMS mirrors 402, 404 over a same angular range, e.g. an oscillation to direct light to or receive light from a same angular range of the field of view 410. The oscillation over the same angular range may include the respective tilting angles of the MEMS mirrors 402, 404 to vary over a same angular range with respect to the respective axis of the MEMS mirrors 402, 404 (in synchronization with one another).

The first MEMS mirror 402 and the second MEMS mirror 404 may be configured to oscillate to cover the first angular range and the second angular range in synchronization with one another. Illustratively, the first angular range may be corresponding to an oscillation about a respective first axis of the MEMS mirrors 402, 404, and the second angular range may be corresponding to an oscillation about a respective second axis of the MEMS mirrors 402, 404. Further illustratively the oscillation about the respective first axis may provide covering the first angular range, and the oscillation about the respective second axis may provide covering the second angular range. The MEMS mirror 402, 404 may be configured to oscillate in synchronization with one another about the respective first axis and the respective second axis (to cover in synchronization with one another the first angular range and the second angular range).

The first MEMS mirror 402 and the second MEMS mirror 404 may be configured (e.g., controlled) to oscillate about at least one of the respective first axis or second axis at the resonant frequency. As described above, the first MEMS mirror 402 and the second MEMS mirror 404 may have a same or substantially same resonant frequency, and the oscillation about at least one of the respective first axis or second axis may be at a same frequency corresponding to the resonant frequency of (at least) one of the first MEMS mirror 402 and/or the second MEMS mirror 404. Illustratively, the oscillation frequency may correspond to the first resonant frequency and/or the second resonant frequency, which may be equal or substantially equal to one another.

As an example, the first MEMS mirror 402 and the second MEMS mirror 404 may be configured (e.g., controlled) to oscillate about only one of the respective first axis or second axis at the resonant frequency. Such axis may be the (respective) fast axis of the MEMS mirrors 402, 404, and the other axis may be the (respective) slow axis of the MEMS mirrors 402, 404. As another example, the first MEMS mirror 402 and the second MEMS mirror 404 may be configured (e.g., controlled) to oscillate about both the respective first and second axis at the resonant frequency. Also in this configuration, one of the first or second axis may be considered as fast axis of the MEMS mirrors 402, 404, and the other one of the first or second axis may be considered as slow axis of the MEMS mirrors 402, 404.

Stated in a different fashion, at least one of the first angular range and/or the second angular range may be corresponding to a respective fast axis (a respective resonant axis) of the first MEMS mirror 402 and the second MEMS mirror 404. The other one of the first angular range and/or the second angular range may be corresponding to a respective slow axis (a respective non-resonant axis) of the first MEMS mirror 402 and the second MEMS mirror 404. Alternatively, both of the first angular range and the second angular range may be corresponding to respective resonant axes of the first MEMS mirror 402 and the second MEMS mirror 404.

As a numerical example, the first MEMS mirror 402 and the second MEMS mirror 404 may be configured such that the respective oscillation about the respective fast axis covers an angular range (in at least one of the first and/or second field of view direction) from −60° to +60° (illustratively, with respect to an optical axis of the LIDAR module 400), for example in the range from −30° to +30°. Only as an example, the respective oscillation about the respective fast axis may cover such angular range in the first field of view direction (the horizontal direction).

As another numerical example, the first MEMS mirror 402 and the second MEMS mirror 404 may be configured such that the respective oscillation about the respective slow axis covers an angular range (in the other one of the first and/or second field of view direction) from −45° to +45° (illustratively, with respect to an optical axis of the LIDAR module 400), for example in the range from −37.5° to +37.5°, for example in the range from −20° to +20°. Only as an example, the respective oscillation about the respective slow axis may cover such angular range in the second field of view direction (the vertical direction).

In the following, some aspects may be described considering an oscillation of the MEMS mirrors 402, 404 about one of the first axis or second axis at the resonant frequency and about the other one of the first axis or second axis at a frequency less than the resonant frequency. It is however understood that the aspects described herein may apply in a corresponding manner to the case in which the MEMS mirrors 402, 404 oscillate at the resonant frequency about both the first and second axis.

Figure 4B:
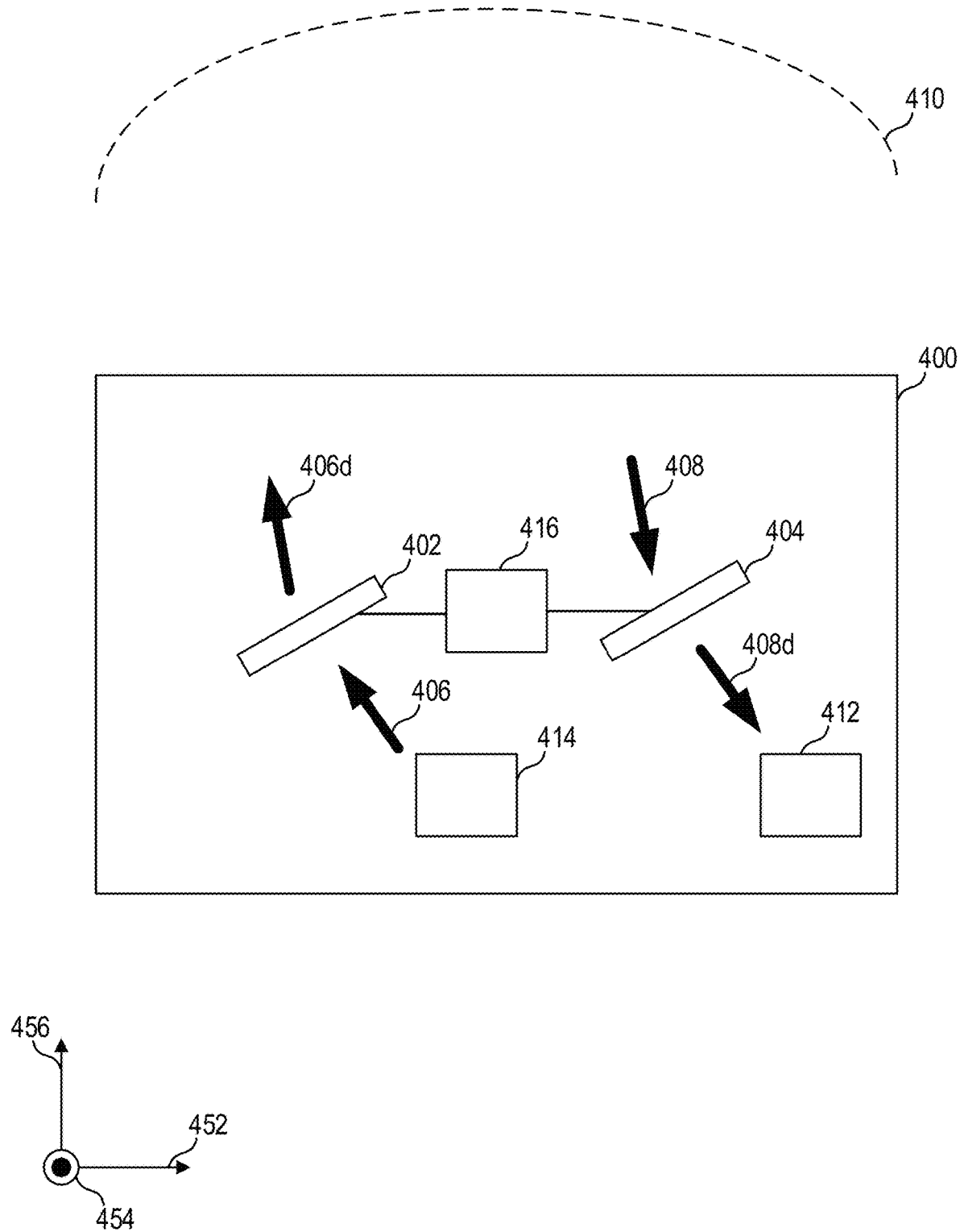

FIG. 4B exemplarily shows the LIDAR module 400 in a schematic top view. FIG. 4B illustrates further exemplary components that the LIDAR module 400 may include.

The LIDAR module 400 may include a light source 414 configured to emit light (illustratively, the light 406 towards the first MEMS mirror 402 in the configuration in FIG. 4B). Illustratively, one of the first MEMS mirror 402 or the second MEMS mirror 404 (e.g., the first MEMS mirror 402 in the configuration in FIG. 4B) may be configured to receive the light that the light source 414 emits and to direct the light towards the field of view 410 of the LIDAR module 400.

The light source 414 may be configured to emit light in a predefined wavelength range, e.g. in accordance with a predefined detection scheme for the LIDAR module 400. As an example, the light source 414 may be configured to emit light in the infrared or near-infrared wavelength range, e.g., in the range from about 700 nm to about 5000 nm, for example in the range from about 900 nm to about 2000 nm, or for example at 905 nm or 1550 nm.

The light source 414 may be configured to emit light in a pulsed manner (e.g., in the case of a time-of-flight configuration of the LIDAR module 400), e.g. a sequence of light pulses, and/or may be configured to emit light in a continuous manner (e.g., in the case of a FMCW configuration of the LIDAR module 400). In the case that the LIDAR module 400 is configured according to a FMCW approach, the light source 414 may be configured to emit light with a varying frequency over time, e.g. a frequency varying from a starting frequency to a final frequency (and back).

The light source 414 may be configured to emit coherent light. As an example, the light source 414 may be or may include a laser source. The laser source may be or may include a laser diode (e.g., a vertical cavity surface emitting laser diode or an edge-emitting laser diode) or a plurality of laser diodes (e.g., arranged in a one-dimensional or two-dimensional array).

The light detector 412 may be configured in accordance with the wavelength of the light that the light source 414 emits. The light detector 412 may be configured to be sensitive to light having wavelength in the wavelength range of the light that the light source 414 emits. Illustratively, the light detector 412 may be configured to provide a signal (e.g., a digital signal) in response to light impinging onto the light detector 412. As an exemplary configuration, the light detector 412 may include one or more photodiodes (e.g., one or more avalanche photodiodes, APD, and/or one or more single-photon avalanche diodes, SPAD) configured to generate an electrical signal (e.g., a photo current) in response to light impinging thereon. The light detector 412 may further include one or more transimpedance amplifiers configured to amplify the electrical signal(s) of the one or more photodiodes (e.g., to convert a photo current in an amplified voltage). The light detector 412 may further include one or more signal converters (e.g., one or more analog-to-digital converters) configured to convert the signal(s) that the one or more photodiodes (and/or the one or more transimpedance amplifiers) provide into a signal that may be further processed, as described in further detail below. The light detector 412 may have an array configuration, e.g. the one or more photodiodes may be disposed in a one-dimensional or two-dimensional array.

The LIDAR module 400 may further include one or more optical systems or components (not shown) to control the propagation of light within the LIDAR module 400 and/or towards and from the field of view 410. As an example, the LIDAR module 400 may include emitter optics disposed between the first MEMS mirror 402 and the field of view 410 and/or receiver optics disposed between the field of view 410 and the second MEMS mirror 404. The emitter optics and/or the receiver optics may include one or more optical components (e.g., one or more mirrors, one or more lenses, etc.) to optically control the propagation of light towards and/or from the field of view 410 (e.g., to direct light towards the field of view 410 and/or to collect light from the field of view 410). As another example, additionally or alternatively, the LIDAR module 400 may include optics disposed between the light source 414 and the first MEMS mirror 402, e.g. to collimate the light that the light source 414 emits, and/or optics disposed between the second MEMS mirror 404 and the light detector 412, e.g. to focus the light onto the light detector 412.

The LIDAR module 400 may further include a driving circuit 416 configured to control the MEMS mirrors of the LIDAR module 400 (e.g., the first MEMS mirror 402 and the second MEMS mirror 404). The driving circuit 416 may be configured to drive an oscillation of the MEMS mirrors 402, 404, e.g. may be configured to control the first MEMS mirror 402 and the second MEMS mirror 404 to oscillate in synchronization with one another to cover the same angular range. The driving circuit 416 may be configured to drive the first MEMS mirror 402 and the second MEMS mirror 404 in synchronization with one another based on the resonant frequency (illustratively, based on the first and/or second resonant frequency, equal or substantially equal to one another).

The driving circuit 416 may be configured to drive an oscillation of the first MEMS mirror 402 and of the second MEMS mirror 404 about at least one respective axis at a same driving frequency corresponding to the resonant frequency (e.g., corresponding to at least one of the first resonant frequency and/or the second resonant frequency). Illustratively, the driving circuit 416 may be configured to drive an oscillation of the first MEMS mirror 402 and of the second MEMS mirror 404 about a respective fast axis at a same fast driving frequency. The fast driving frequency may correspond to the resonant frequency (e.g., may correspond to at least one of the first resonant frequency and/or the second resonant frequency). Only as a numerical example, the fast driving frequency may be in a range from 1 kHz to 50 kHz, for example in the range from 5 kHz to 40 kHz, for example in the range from 15 kHz to 30 kHz.

As an example, the driving circuit 416 may be configured to drive the oscillation of the first MEMS mirror 402 and the second MEMS mirror 404 about the respective two axes at the (same) fast driving frequency.

As another example, the driving circuit 416 may be configured to drive the oscillation of the first MEMS mirror 402 and the second MEMS mirror 404 about the respective fast axis at the fast driving frequency, and about the respective slow axis at a same slow driving frequency. The slow driving frequency may be less than the fast driving frequency, illustratively may be less than the resonant frequency (e.g., less than both the first resonant frequency and the second resonant frequency). As a numerical example, the slow driving frequency may be less than one-fifth of the fast driving frequency, for example less than one-tenth of the fast driving frequency. As a numerical example, the slow driving frequency may be in the range from 50 Hz to 500 Hz, for example in the range from 100 Hz to 200 Hz.

The driving circuit 416 may be configured to provide corresponding driving signal(s) at the MEMS mirrors 402, 404, e.g. corresponding driving current(s) or driving voltage(s). The driving signal may oscillate at the desired (e.g., fast or slow) driving frequency to drive the oscillation of the corresponding MEMS mirror.

Considering the configuration in FIG. 4B, the driving circuit 416 may be configured to provide a first driving signal at the first MEMS mirror 402 to drive an oscillation of the first MEMS mirror 402 about the respective fast axis, and a second driving signal at the second MEMS mirror 404 to drive an oscillation of the second MEMS mirror 404 about the respective fast axis. The driving circuit 416 may be configured to generate one of the first driving signal and the second driving signal based on the other of the first driving signal and the second driving signal (see also FIG. 4C), e.g. may be configured to generate the second driving signal based on the first driving signal (or vice versa). Illustratively, considering the case in which the first resonant frequency and the second resonant frequency are not exactly equal to one another, the driving circuit 416 may be configured to generate the first driving signal based on the first resonant frequency and to generate the second driving signal to correspond to the first driving signal (or vice versa). This may provide driving both MEMS mirrors 402, 404 at the same driving frequency to synchronize the light emission and detection in the LIDAR module 400. In this configuration, one of the driving signals may be understood as a "master" driving signal, and the other driving signal generated on the basis of the "master" driving signal may be understood as a "slave" driving signal (see also FIG. 5A).

It is understood that the driving circuit 416 may be further configured to provide a third driving signal at the first MEMS mirror 402 to drive an oscillation of the first MEMS mirror 402 about the respective slow axis, and a fourth driving signal at the second MEMS mirror 404 to drive an oscillation of the second MEMS mirror 404 about the respective slow axis.

The driving circuit 416 may be further configured to monitor the oscillation of the MEMS mirrors 402, 404 and to adapt the driving of the MEMS mirrors 402, 404 accordingly. Illustratively, the driving circuit 416 may be configured to adapt the driving (e.g., to adapt the generation of the driving signals) to ensure the synchronized oscillation of the MEMS mirrors 402, 404.

The driving circuit 416 may be configured to monitor a phase of the oscillation of the MEMS mirrors 402, 404 and to adapt the control of the oscillation based on the monitored phase. Illustratively, even providing a synchronized driving in terms of frequency, there may still be a phase difference in the oscillation of the MEMS mirrors 402, 404, which the driving circuit 416 may be configured to compensate the phase difference to ensure the synchronized light emission and detection. The phase difference may occur, for example, in the case that the first resonant frequency and the second resonant frequency are not equal to one another, so that the driving of one of the MEMS mirrors 402, 404 occurs at a driving frequency slightly different from its resonant frequency. The driving circuit 416 may be configured to determine (e.g., to calculate, or to measure) a phase difference between a first phase of the oscillation of the first MEMS mirror 402 about the respective fast axis and a second phase of the oscillation of the second MEMS mirror 404 about the respective fast axis, and to impose a delay on at least one of the first driving signal and/or the second driving signal in accordance with the measured phase difference. The driving circuit 416 may be configured to impose the delay onto the driving signal generated on the basis of the other driving signal (e.g., onto the second driving signal generated on the basis of the first driving signal, or vice versa). As an exemplary configuration (see also FIG. 5A) the driving circuit 416 may include a controllable delay element along at least one of the paths coupling the driving circuit 416 with the MEMS mirrors 402, 404.

The delay may be configured (e.g., selected) to compensate the determined phase difference. The delay may be configured (e.g., selected) in such a way that a phase difference between the first phase of the oscillation of the first MEMS mirror 402 about the respective fast axis and the second phase of the oscillation of the second MEMS mirror 404 about the respective fast axis converges substantially to zero. The phase difference may converge to zero over time, e.g. over the subsequent oscillations of the MEMS mirrors 402, 404.

As an example, the driving circuit 416 may be configured to determine the phase difference based on zero crossing detection. Illustratively, the determination of the phase difference may be based on a first zero crossing detection signal corresponding to the first MEMS mirror 402 and a second zero crossing detection signal corresponding to the second MEMS mirror 404.

As an additional or alternative control measure, the driving circuit 416 may be configured to adapt a phase of the driving signals based on the phase of the oscillation. The driving circuit 416 may be configured to measure a phase difference between the oscillation of the MEMS mirrors and the phase of the respective driving signal(s), and to adjust (in other words, to vary) the phase of the driving signal(s) in accordance with the determined phase difference. As an example, the driving circuit 416 may be configured to determine (e.g., to measure, to calculate) a phase difference between a first phase of the oscillation of the first MEMS mirror 402 about the respective fast axis and a phase of the first driving signal, and to adjust a phase of the first driving signal in accordance with the measured phase difference. As another example, the driving circuit 416 may be configured to determine a phase difference between a second phase of the oscillation of the second MEMS mirror 404 about the respective fast axis and a phase of the second driving signal, and to adjust a phase of the second driving signal in accordance with the measured phase difference. The driving circuit 416 may be configured to vary the phase of the driving signal(s) (of the first and/or second driving signal) in such a way that the phase difference between the (first and/or second) phase of the oscillation and the phase of the (first and/or second) converges towards a predefined value (e.g., $3\pi/2$). This control over the phase of the driving signal(s) may provide maintaining the oscillation of the MEMS mirrors 402, 404 at the desired oscillation frequency. Illustratively, the driving circuit 416 may be configured to implement a phase-locked-loop (PLL) to get the peak of the frequency response of the MEMS mirrors 402, 404. In the case that the generation of one of the driving signals is based on the other driving signal, the driving circuit 416 may be configured to implement a PLL only for the "master" driving signal, and the "slave" driving signal may follow accordingly.

It is understood that the driving circuit 416 may be further configured to determine a phase difference between a phase of an oscillation of the MEMS mirrors 402, 404 about the respective slow axis and the corresponding driving signal, and to adjust a phase of the driving signal(s) accordingly.

It is also understood that the LIDAR module may include additional components, not shown, such as, for example, a processing circuit configured to process the light that the LIDAR module 400 receives, illustratively configured to process the signal that the light detector 412 generates. In a time-of-flight configuration, the processing circuit may be configured to determine (e.g., to calculate or to measure) a time of flight of the light that the LIDAR module 400 emits (and receives back), to determine spatial information of the field of view 410. In a FMCW configuration, the processing circuit may be configured to determine a frequency difference between the emitted and received light, to determine information about the objects in the field of view 410 (e.g., the distance from the LIDAR module 400, the speed, etc.).

Figure 4C:
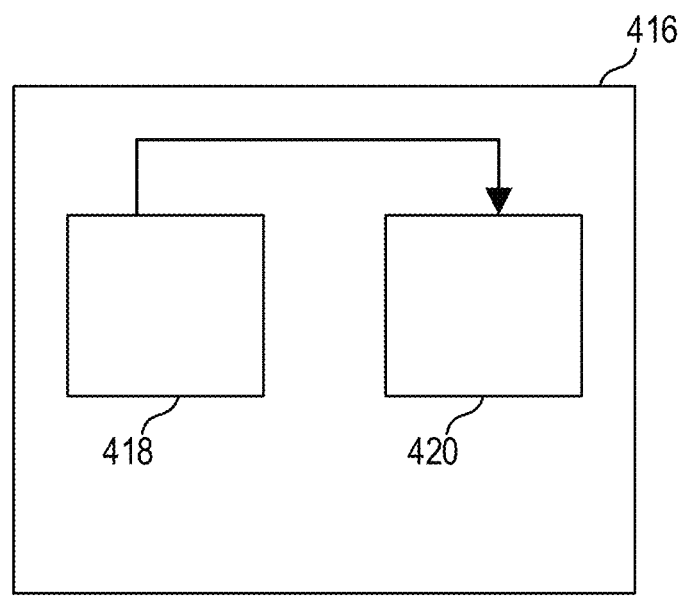
FIG. 4C exemplarily shows a driving circuit in a schematic view.

FIG. 4C exemplarily shows the driving circuit 416 in a schematic view. The configuration in FIG. 4C may be an exemplary configuration of the driving circuit 416; it is however understood that other configurations (e.g., with additional, less, or alternative components) may be provided.

The driving circuit 416 may include dedicated driving circuits for each MEMS mirror of the LIDAR module 400. Considering the exemplary configuration in FIG. 4A to FIG. 4C, the driving circuit 416 may include a first driving circuit 418 (also referred to herein as first driving sub-circuit) corresponding to (e.g., coupled to) the first MEMS mirror 402 and a second driving circuit 420 (also referred to herein as second driving sub-circuit) corresponding to (e.g., coupled to) the second MEMS mirror 404.

The first driving circuit 418 may be configured to control the first MEMS mirror 402 (illustratively, to drive the oscillation of the first MEMS mirror 402), and the second driving circuit 420 may be configured to control the second MEMS mirror 404 (illustratively, to drive the oscillation of the second MEMS mirror 404).

The driving circuit 416 may be configured such that one of the first driving circuit 418 or the second driving circuit 420 may be understood as a master circuit and the other one of the first driving circuit 418 or the second driving circuit 420 may be understood as a slave circuit. One of the first driving circuit 418 or the second driving circuit 420 may be configured to receive the driving signal of the other one of the first driving circuit 418 or the second driving circuit 420 and to generate its own driving signal accordingly.

In the configuration in FIG. 4C, the first driving circuit 418 may be configured (as master) to provide the first driving signal to the second driving circuit 420 (in addition to the first MEMS mirror 402), and the second driving circuit 420 may be configured (as slave) to generate the second driving signal corresponding to the (received) first driving signal. Illustratively, the first driving circuit 418 may be configured to drive the oscillation of the first MEMS mirror 402 about the respective fast axis at a first fast driving frequency (corresponding to the first resonant frequency), and the second driving circuit 420 may be configured to receive fast driving frequency information from the first driving circuit 418 and to drive an oscillation of the second MEMS mirror 404 about the respective fast axis at a second fast driving frequency corresponding to the first fast driving frequency. It is understood that the exchange of information may occur also for the slow driving frequency. It is also understood that also the inverse configuration may be provided. The master-slave configuration may increase the accuracy of the synchronized driving of the MEMS mirrors 402, 404.

A LIDAR module (e.g., the LIDAR module 400) as described herein may be understood as a "Twin Mirror Lidar" design. This design encompasses the process of selection of a pair of "twin" MEMS components from a wafer (as described in relation to FIG. 3), the supporting electronic circuitry and the supporting control loop (as described in relation to FIG. 4A to FIG. 4C), which, altogether, enable a LIDAR system in which the transmitting (TX) MEMS direction is synced in time and phase with the receiving (RX) MEMS direction in 2D. Based on production data, the yield of the "twin" MEMS selection process may be better than 97% (as described in relation to FIG. 2B).

According to simulations the tracking accuracy of such arrangement may be better than ±2° in a 2D space. Illustratively, the RX channel may collect light that only comes from a small cone (of about ±2 deg) around the direction of the TX channel, thus dramatically reducing the amount of collected ambient light. As a result, a high signal to noise ratio (SNR) may be maintained even in challenging outdoor conditions resulting in tens of meters range LIDAR performance even in daylight conditions, compared to sub-meter performance of other existing LIDAR solutions. Illustratively, the LIDAR system may have excellent immunity to ambient light and may perform well even in the brightest outdoor conditions.

As a numerical example, a LIDAR system as described herein may achieve a 4°×4° collection angle, thus a solid angle of 0.0049 steradians, which may be about 20 times lower of existing LIDAR systems. Hence the SNR may be improved by a factor of 20 and the range by a factor of 4.5.

Another significant advantage of the proposed system is that, in view of the fact that the RX path and the TX path are distinct from one another (and may include different optic components), it may be possible to significantly increase the collection area of the RX channel without correspondingly increasing the size and/or divergence angle of the scanning beam, thus increasing the collected signal (and hence the SNR and range) without sacrificing the spatial resolution. Compared with the through-the-mirror design, the back-reflection problem from in-line optical interfaces is solved completely in view of the TX and the RX channel not sharing same optical path.

Another advantage of this technology is the ability to utilize existing Application Specific Integrated Circuit (ASIC) architecture already developed for existing LIDAR products.

A LIDAR system as described herein may be understood as a LIDAR system that includes a MEMS doublet and has a high outdoor performance specification (e.g., a high range in outdoor conditions). The operation of the LIDAR system may be evaluated, for example, with non-destructive tests. Considering a DUT (device under test) operating in a normal mode, the validation may include: 1) Putting a lens on top of the TX channel that images the TX MEMS on the target (effectively creating range-finder mode with a static TX direction); and 2) Receiving IR or Depth image from the DUT. In the case that the image is uniform it indicates that the RX channel is not following the TX direction. In the case that the image includes a hot line followed by non-detected region it indicates that the RX MEMS is synchronized (in other words, synced) only on one axis with the TX MEMS. In the case that the image includes a hot spot followed by non-detected region it indicates that the RX MEMS is synced on both axis with the TX MEMS. The operation at the resonant frequency may be verified using a fast photo-detector configured to sense the TX beam scanning frequency. In the case that the measured pulse frequency is higher than about 100 Hz the mirror scan may be resonant.

Another way of evaluating the operation of the LIDAR system may be via a tear-down process to determine, e.g. by means of a fast-speed camera, whether ×2 MEMS mirrors in the device operate in 2D and in synchronization (in other words, in sync) with one another.

Figure 5A:
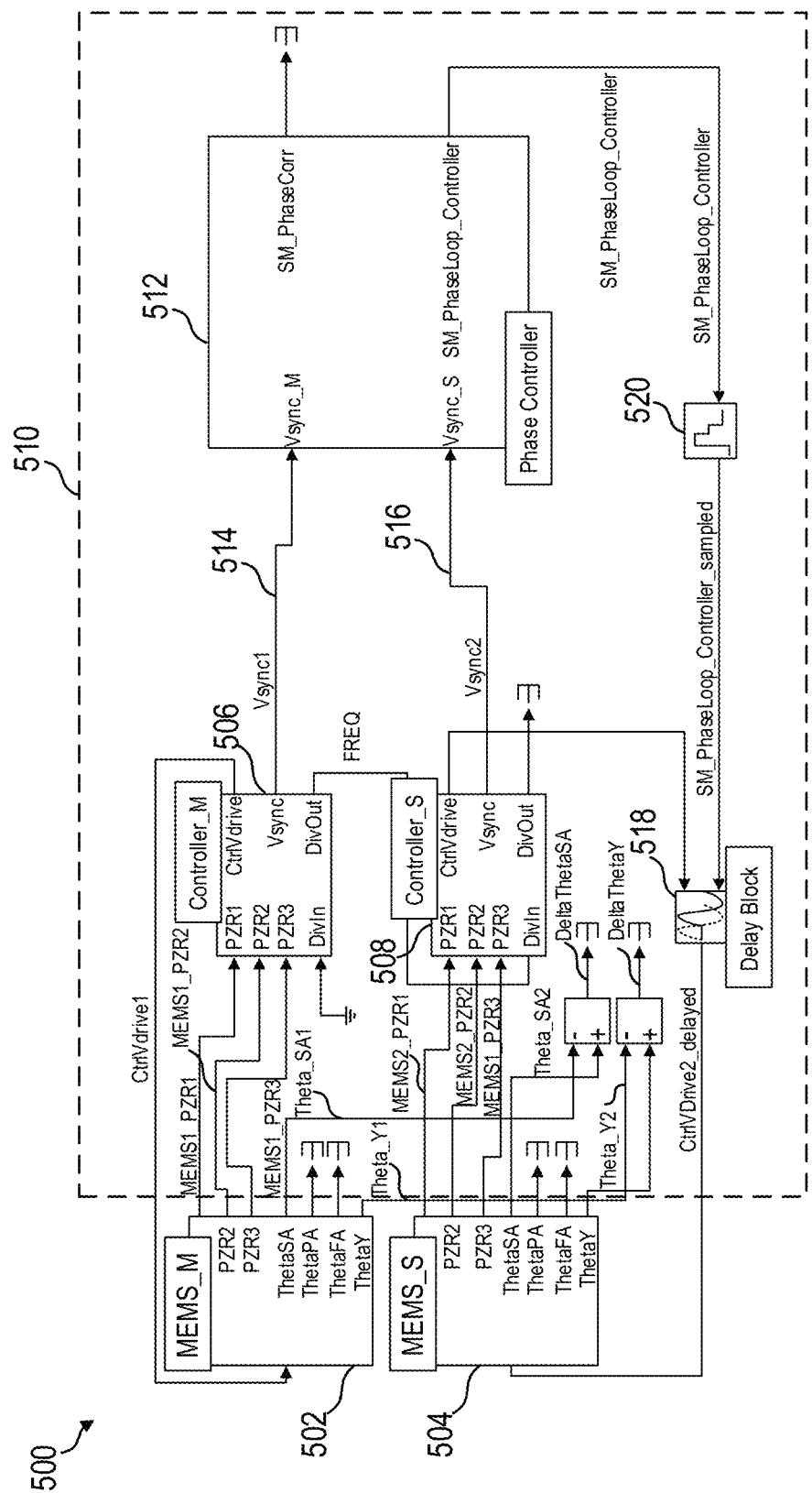
FIG. 5A exemplarily shows an exemplary configuration of a LIDAR module in a schematic view.

FIG. 5A exemplarily shows a LIDAR module 500 in a schematic view. FIG. 5A shows the LIDAR module 500 from the perspective of the circuitry, e.g. the schematics of the supporting electronic and control blocks. The LIDAR module 500 may be an exemplary configuration of the LIDAR module 400 described in relation to FIG. 4A to FIG. 4C (the components of the LIDAR module 500 may be exemplary configurations of the components of the LIDAR module 400).

The LIDAR module 500 may include a master MEMS mirror 502, MEMS_M, and a slave MEMS mirror 504, MEMS_S, e.g. as exemplary configurations of the first MEMS mirror 402 and the second MEMS mirror 404. The LIDAR module 500 may include a master controller 506 (CONTROLLER_M) configured to drive the master MEMS mirror 502, and a slave controller 508 (CONTROLLER_S) configured to drive the slave MEMS mirror 504. The master controller 506 and the slave controller 508 may be part of a driving circuit 510 of the LIDAR module 500 (e.g., an exemplary configuration of the driving circuit 416).

The slave controller 508 may receive the drive fast-axis frequency (illustratively, the driving signal to drive the oscillation of the master MEMS mirror 502 about the fast axis) of the master controller 508, and may be configured to use the (received) drive fast-axis frequency to drive the slave MEMS mirror 504 fast axis (illustratively, as driving signal to drive the oscillation of the slave MEMS mirror 504 about the fast axis).

The LIDAR module 500 (e.g., as part of the driving circuit 510) may include a phase controller 512. The phase controller 512 may be configured to receive the fast-axis zero-crossing signal 514, 516 (Vsync1 and Vsync2) from both the master controller 506 and the slave controller 508. Illustratively, the fast-axis zero-crossing signals 514, 516 may be mixed in the phase controller 512. The phase controller 512 may be configured to calculate a phase delay between the master MEMS mirror 502 and the slave MEMS mirror 504. The phase controller 512 may be configured to use the calculated information to generate a driving signal for a controllable delay element 518 (a delay block, e.g. part of the driving circuit 510). The delay block 518 may be configured to delay the driving signal to the slave MEMS mirror 504 by the defined amount of time (e.g., by the amount of time that the driving signal of the phase controller 512 instructs). A sampler 520 may be configured to sample the driving signal of the phase controller 512 and to provide a sampled driving signal to the delay block 518.

The supporting electronics of the LIDAR module 500 may thus include two identical controllers. The master controller 506 configured to control the master MEMS mirror 502, and to set both low-frequency (slow) drive amplitude for the slow axis, and the high-frequency (fast) drive amplitude frequency values to drive the master MEMS mirror 502. The slave controller 508 may be configured to obtain the high-frequency drive frequency information from the master controller 506 and to lock the fast drive frequency value to it to ensure same frequency operation of both MEMS mirrors 502, 504.

Figure 5B:
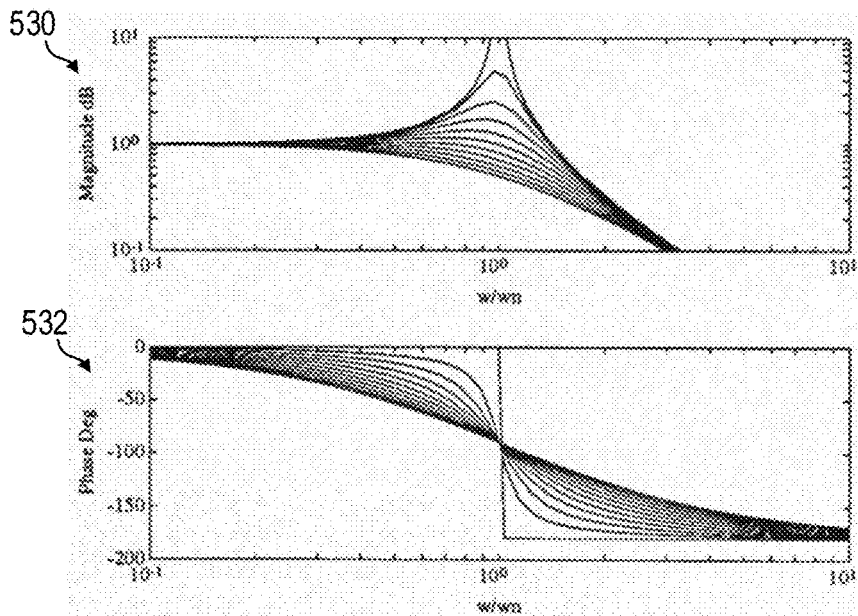
FIG. 5B exemplarily shows Bode diagrams of second order linear systems with different dumping coefficients.

The frequency may be locked to the resonance of the master MEMS mirror 502 to maximize its drive efficiency. The slave MEMS mirror 504 may be driven by off-resonant frequency (in case the resonant frequency of the slave MEMS mirror 504 and the resonant frequency of the master MEMS mirror 502 are not exactly equal to one another), so that a significant phase delay between the two MEMS fast axis movement may occur. This may be due to the fact that for a resonant system the phase changes rapidly near the resonance, as illustrated in FIG. 5B. To compensate for this effect, the delay block 518 may be configured to introduce a delay to the slave MEMS drive by a set point specifying the delay time. The phase controller 512 may be configured to calculate the set point for the delay block 518 based on the calculated and/or measured delay between the two MEMS fast axis. The calculation may be based on zero-crossing detection signals 514, 516 (Vsync1 and Vsync2) from the master MEMS mirror 502 and the slave MEMS mirror 504, respectively. As a result, both MEMS mirrors may operate in phase in both fast and slow axis.

FIG. 5B exemplarily shows Bode diagrams 530, 532 of second order linear systems with different dumping coefficients. As the Q factor of the resonant system becomes larger the phase diverges rapidly from its nominal −90° value at the resonance.

Figure 5C:
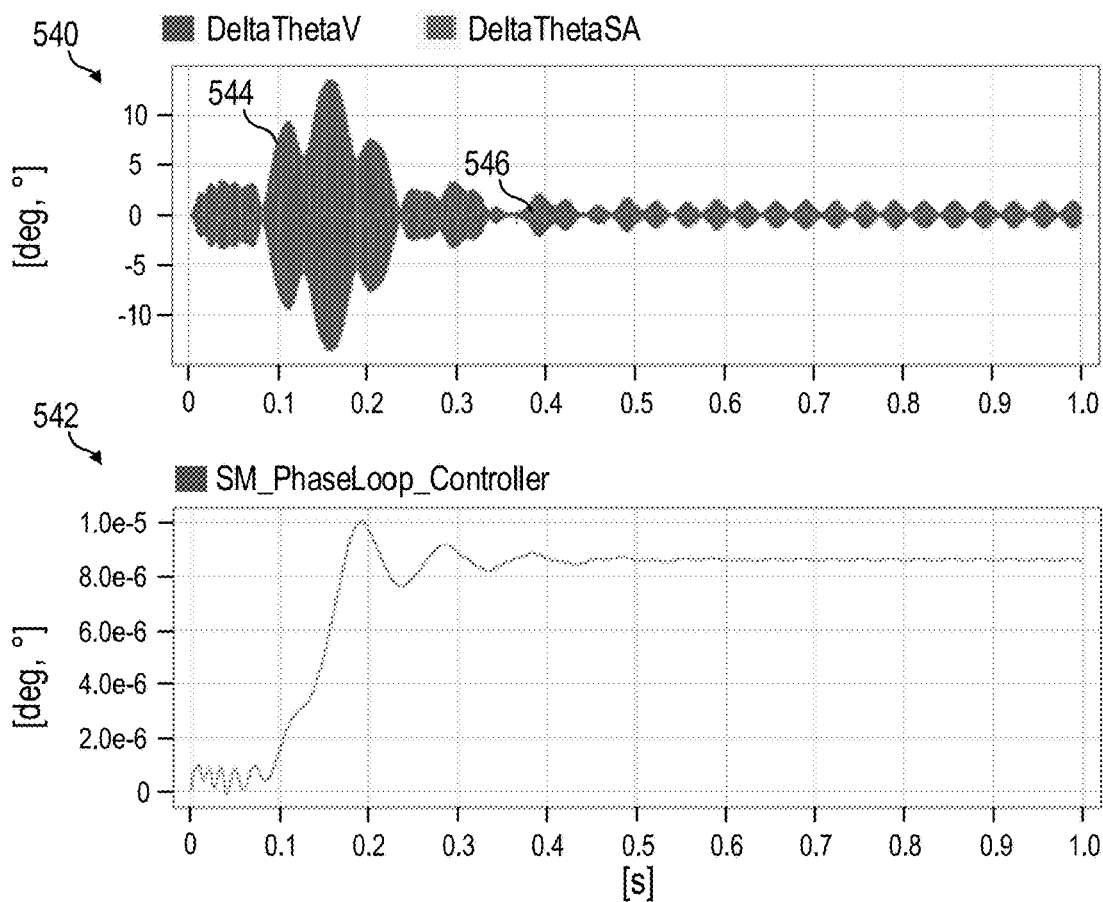
FIG. 5C exemplarily shows the results of a simulation of the operation of a LIDAR module.

FIG. 5C exemplarily shows two graphs 540, 542 illustrating the results of a simulation of the operation of a LIDAR module configured as described herein (e.g., of the LIDAR module 500). The graphs 540, 542 illustrate the results of a full Simulink simulation that implement both MEMS electro-mechanical model and controller logics. In this exemplary simulation, the resonant frequency of the slave MEMS mirror (e.g., the slave MEMS mirror 504) is set to be 10 Hz higher than the resonant frequency of the master MEMS mirror (e.g., of the master MEMS mirror 502).

The first graph 540 shows top figure shows fast axis 544 and slow axis 546 angular difference between master and slave MEMS in degrees (over time, in seconds). The second graph 542 shows the phase delay controller drive signal. After 0.3 s, the difference between the oscillation of the master MEMS mirror and of the slave MEMS mirror converges to less than 2° difference (illustratively, the system converges after 0.3 s and the residual error in both axes is smaller than 2°). Hence, the simulation shows that with a LIDAR module configured as described herein the collection cone of the RX channel may be designed to be close to 4° across, thus providing synchronized light emission and collection.

Figure 6:
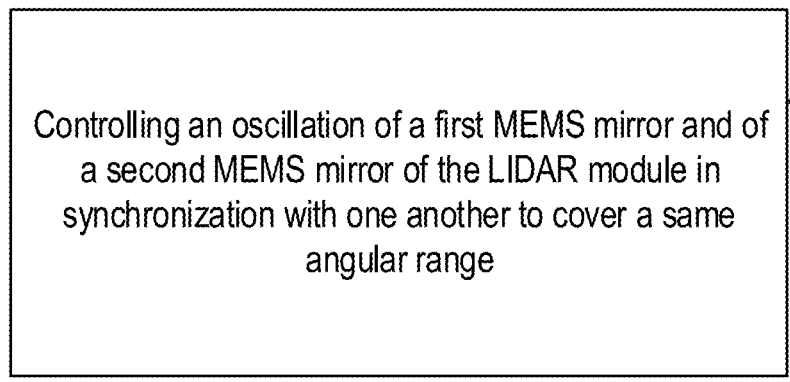
FIG. 6 exemplarily shows a schematic flow diagram of a method of operating a LIDAR module.

FIG. 6 exemplarily shows a flow diagram of a method 600 of operating a LIDAR module (e.g., of operating the LIDAR module 400, 500 described in relation to FIG. 4A to FIG. 5C).

The method 600 may include, in 610, controlling an oscillation of a first MEMS mirror and of a second MEMS mirror of the LIDAR module in synchronization with one another to cover a same angular range (e.g., a first angular range in a first field of view direction and/or a second angular range in a second field of view direction). Illustratively, the method 600 may include controlling the MEMS mirrors of a MEMS mirror pair (e.g., in a LIDAR module) to oscillate in synchronization with one another (e.g., about a respective fast axis and about a respective slow axis). One of the first MEMS mirror or the second MEMS mirror may be configured as transmitting mirror (e.g., to direct light towards a field of view of the LIDAR module), and the other one of the first MEMS mirror or the second MEMS mirror may be configured as receiving mirror (e.g., to receive light from the field of view, and to direct the light towards a light detector of the LIDAR module).

The method 600 may include driving an oscillation of a first MEMS mirror and a second MEMS mirror about a respective fast axis at a same fast driving frequency and driving an oscillation of a first MEMS mirror and a second MEMS mirror about a respective slow axis at a same slow driving frequency. The fast driving frequency may correspond to the resonant frequency of the MEMS mirrors, e.g. to the resonant frequency of at least one of the first MEMS mirror and/or the second MEMS mirror (which may be substantially equal to one another). Illustratively, the method 600 may include controlling the first MEMS mirror and the second MEMS mirror to oscillate in synchronization with one another at a driving frequency corresponding to the resonant frequency (of at least one of the MEMS mirrors) about at least one axis.

In the following, various examples are provided that may include one or more aspects described above with reference to a LIDAR module (e.g., the LIDAR module 400, 500), a MEMS mirror (e.g., the MEMS mirror 402, 404, 502, 504), and methods (e.g., the method 300 and/or the method 600). It may be intended that examples described in relation to the LIDAR module or the MEMS mirror may apply also to the methods, and vice versa.

Example 1 is a light detection and ranging (LIDAR) module including: a light detector configured to detect light; a first micro-electromechanical systems (MEMS) mirror and a second MEMS mirror, wherein one of the first MEMS mirror or the second MEMS mirror is configured to direct received light towards a field of view of the LIDAR module, wherein the other one of the first MEMS mirror or the second MEMS mirror is configured to receive light from the field of view of the LIDAR module and to direct the light towards the light detector, and wherein the first MEMS mirror and the second MEMS mirror are configured to oscillate in synchronization with one another to cover a same angular range. Illustratively, the first MEMS mirror and the second MEMS mirror may be configured to allow a control of a respective oscillation (e.g., about the respective resonant axis) to cover a same angular range in synchronization with one another.

In Example 2, the LIDAR module according to example 1 may optionally further include that the first MEMS mirror and the second MEMS mirror are configured to oscillate about a respective fast axis at a respective resonant frequency. Illustratively, the first MEMS mirror and the second MEMS mirror may be configured to allow a control of a respective oscillation about the respective fast axis at the respective resonant frequency (which may be the same or substantially the same for the first MEMS mirror and the second MEMS mirror) in synchronization with one another.

In Example 3, the LIDAR module according to example 1 or 2 may optionally further include that the angular range includes a first angular range along a first field of view direction and a second angular range along a second field of view direction, and that the first MEMS mirror and the second MEMS mirror are configured to oscillate to cover the first angular range and the second angular range in synchronization with one another.

In Example 4, the LIDAR module according to example 3 may optionally further include that the first field of view direction corresponds to a respective fast axis of the first MEMS mirror and the second MEMS mirror, and that the second field of view direction corresponds to a respective slow axis of the first MEMS mirror and the second MEMS mirror.

In Example 5, the LIDAR module according to any one of examples 1 to 4 may optionally further include that the first MEMS mirror and the second MEMS mirror are configured such that the respective oscillation about the respective fast axis (illustratively, an oscillation at the respective resonant frequency) covers an angular range from −60° to +60°, for example a range from −30° to +30°.

In Example 6, the LIDAR module according to any one of examples 1 to 5 may optionally further include that the first MEMS mirror and the second MEMS mirror are configured such that the respective oscillation about the respective slow axis (illustratively, an oscillation at a frequency less than the respective resonant frequency) covers an angular range (e.g., in the second field of view direction) from −45° to +45°, for example a range from −37.5° to +37.5°, for example a range from −20° to +20°.

In Example 7, the LIDAR module according to any one of examples 1 to 6 may optionally further include that the first MEMS mirror and the second MEMS mirror have a (same or) substantially same resonant frequency.

In Example 8, the LIDAR module according to any one of examples 1 to 7 may optionally further include that the first MEMS mirror has a first resonant frequency, that the second MEMS mirror has a second resonant frequency, and that a difference between the first resonant frequency and the second resonant frequency is in a range from 0 Hz to 10 Hz, for example in a range from 0 Hz to 5 Hz.

In Example 9, the LIDAR module according to any one of examples 1 to 8 may optionally further include that the first MEMS mirror has a first resonant frequency, that the second MEMS mirror has a second resonant frequency, and that a percentage difference between the first resonant frequency of the first MEMS mirror and the second resonant frequency of the second MEMS mirror is in a range from 0% to 3%, for example in a range from 0% to 1%.

In Example 10, the LIDAR module according to any one of examples 1 to 9 may optionally further include a driving circuit configured to drive an oscillation of the first MEMS mirror and of the second MEMS mirror about a respective fast axis at a same fast driving frequency. The fast driving frequency corresponds to a resonant frequency of the first MEMS mirror and/or the second MEMS mirror (e.g., to at least one of the first resonant frequency and/or the second resonant frequency).

In Example 11, the LIDAR module according to example 10 may optionally further include that the fast driving frequency is in a range from 1 kHz to 50 kHz, for example in the range from 5 kHz to 40 kHz, for example in the range from 15 kHz to 30 kHz.

In Example 12, the LIDAR module according to example 10 or 11 may optionally further include that the driving circuit is configured to provide a first driving signal at the first MEMS mirror to drive an oscillation of the first MEMS mirror about the respective fast axis, that the driving circuit is configured to provide a second driving signal at the second MEMS mirror to drive an oscillation of the second MEMS mirror about the respective fast axis, and that the driving circuit is configured to generate the second driving signal based on the first driving signal.

In Example 13, the LIDAR module according to example 12 may optionally further include that the driving circuit is configured to determine a phase difference between a first phase of the oscillation of the first MEMS mirror about the respective fast axis and a second phase of the oscillation of the second MEMS mirror about the respective fast axis, and that the driving circuit is configured to impose a delay on the second driving signal in accordance with the measured phase difference.

In Example 14, the LIDAR module according to example 13 may optionally further include that the determination is based on a first zero crossing detection signal corresponding to the first MEMS mirror and a second zero crossing detection signal corresponding to the second MEMS mirror.

In Example 15, the LIDAR module according to example 13 or 14 may optionally further include that the delay is selected in such a way that a phase difference between the first phase of the oscillation of the first MEMS mirror about the respective fast axis and the second phase of the oscillation of the second MEMS mirror about the respective fast axis converges substantially to zero.

In Example 16, the LIDAR module according to any one of examples 12 to 15 may optionally further include that the driving circuit is configured to determine a phase difference between a first phase of the oscillation of the first MEMS mirror about the respective fast axis and a phase of the first driving signal, and that the driving circuit is configured to vary a phase of the first driving signal in accordance with the measured phase difference.

In Example 17, the LIDAR module according to example 16 may optionally further include that the driving circuit is configured to vary the phase of the first driving signal in such a way that the phase difference between the first phase of the oscillation of the first MEMS mirror about the respective fast axis and the phase of the first driving signal converges towards a predefined value (e.g., $3\pi/2$).

In Example 18, the LIDAR module according to any one of examples 12 to 17 may optionally further include that the driving circuit includes a first driving circuit corresponding to the first MEMS mirror and a second driving circuit corresponding to the second MEMS mirror, that the first driving circuit is configured to drive an oscillation of the first MEMS mirror about the respective fast axis at a first fast driving frequency, that the first fast driving frequency corresponds to a first resonant frequency of the first MEMS mirror, and that the second driving circuit is configured to receive fast driving frequency information from the first driving circuit and to drive an oscillation of the second MEMS mirror about the respective fast axis at a second fast driving frequency corresponding to the first fast driving frequency.

In Example 19, the LIDAR module according to any one of examples 12 to 18 may optionally further include that the driving circuit is configured to drive an oscillation of the first MEMS mirror and of the second MEMS mirror about a respective slow axis at a same slow driving frequency, and that the slow driving frequency is less than the resonant frequency.

In Example 20, the LIDAR module according to example 19 may optionally further include that the slow driving frequency is in a range from 50 Hz to 500 Hz, for example in the range from 100 Hz to 200 Hz.

In Example 21, the LIDAR module according to any one of examples 1 to 20 may optionally further include that the first MEMS mirror and the second MEMS mirror are selected from a plurality of MEMS mirrors formed on a same substrate.

In Example 22, the LIDAR module according to any one of examples 1 to 21 may optionally further include a light source configured to emit light (e.g., a laser source configured to emit laser light), and that one of the first MEMS mirror or the second MEMS mirror is configured to receive the light that the light source emits and to direct the light towards the field of view of the LIDAR module.

In Example 23, the LIDAR module according to any one of examples 1 to 22 may optionally further include that the light detector includes an avalanche photodiode or a single photon avalanche diode.

Example 24 is a LIDAR module including: a light source configured to emit light; a light detector configured to detect light; a first MEMS mirror and a second MEMS mirror, wherein one of the first MEMS mirror or the second MEMS mirror is configured to receive the light that the light source emits, and to direct the light towards a field of view of the LIDAR module, wherein the other one of the first MEMS mirror or the second MEMS mirror is configured to receive light from the field of view of the LIDAR module and to direct the light towards the light detector, and wherein the first MEMS mirror and the second MEMS mirror have substantially a same resonant frequency; and a driving circuit configured to drive the first MEMS mirror and the second MEMS mirror in synchronization with one another based on the resonant frequency.

In Example 25, the LIDAR module according to example 24 may include one or more features according to any one of examples 1 to 23.

Example 26 is a LIDAR module including: a light detector configured to detect light; a first MEMS mirror and a second MEMS mirror, wherein one of the first MEMS mirror or the second MEMS mirror is configured to direct received light towards a field of view of the LIDAR module, wherein the other one of the first MEMS mirror or the second MEMS mirror is configured to receive light from the field of view of the LIDAR module and to direct the light towards the light detector, and wherein the first MEMS mirror and the second MEMS mirror are configured to oscillate in synchronization with one another about a respective resonant axis.

In Example 27, the LIDAR module according to example 26 may include one or more features according to any one of examples 1 to 25.

Example 28 is a method of operating a LIDAR module, the LIDAR module including a first MEMS mirror and a second MEMS mirror, wherein one of the first MEMS mirror or the second MEMS mirror is configured to direct received light towards a field of view of the LIDAR module and the other one of the first MEMS mirror or the second MEMS mirror is configured to receive light from the field of view of the LIDAR module, the method including: controlling an oscillation of the first MEMS mirror and of the second MEMS mirror in synchronization with one another to cover a same angular range.

In Example 29, the method of example 28 may optionally further include that the first MEMS mirror and the second MEMS mirror have substantially a same resonant frequency.

In Example 30, the method according to example 28 or 29 may include one or more features according to any one of examples 1 to 27.

Example 31 is a method of operating a LIDAR module, the LIDAR module including a first MEMS mirror and a second MEMS mirror, wherein one of the first MEMS mirror or the second MEMS mirror is configured to direct received light towards a field of view of the LIDAR module and the other one of the first MEMS mirror or the second MEMS mirror is configured to receive light from the field of view of the LIDAR module, the method including: controlling an oscillation of the first MEMS mirror and of the second MEMS mirror in synchronization with one another about a respective resonant axis.

In Example 32, the method according to example 31 may include one or more features according to any one of examples 1 to 30.

Example 33 is one or more non-transitory computer readable media including programmable instructions thereon, that when executed by one or more processors of a device (e.g., of a LIDAR module), cause the device to perform the method according to example 31 or 32.

Example 34 is a method of operating a LIDAR module, the method including: driving an oscillation of a first MEMS mirror and a second MEMS mirror about a respective fast axis at a same fast driving frequency, driving an oscillation of a first MEMS mirror and a second MEMS mirror about a respective slow axis at a same slow driving frequency, wherein one of the first MEMS mirror or the second MEMS mirror is configured as transmitting mirror and the other one of the first MEMS mirror or the second MEMS mirror is configured as receiving mirror, wherein the first MEMS mirror and the second MEMS mirror have substantially a same resonant frequency, and wherein the fast driving frequency corresponds to the resonant frequency of at least one of the first MEMS mirror and/or the second MEMS mirror.

In Example 35, the method according to example 33 may include one or more features according to any one of examples 1 to 32.

Example 36 is one or more non-transitory computer readable media including programmable instructions thereon, that when executed by one or more processors of a device (e.g., of a LIDAR module), cause the device to perform the method according to example 34 or 35.

Example 37 is a method of providing MEMS mirrors (e.g., for use in a LIDAR module), the method including:

forming a plurality of MEMS mirrors on a substrate; and determining a resonant frequency distribution of the plurality of MEMS mirrors to select one or more MEMS mirror pairs from the plurality of MEMS mirrors, wherein the MEMS mirrors of a MEMS mirror pair have substantially a same resonant frequency.

In Example 38 the method according to example 37 may optionally further include that the substrate is or includes a semiconductor wafer.

In Example 39 the method according to example 37 or 38 may optionally further include that the resonant frequency distribution includes a correlation between a position on the substrate of a MEMS mirror of the plurality of MEMS mirrors and the respective resonant frequency.

In Example 40 the method according to any one of examples 37 to 39 may optionally further include calibrating the MEMS mirrors of at least one MEMS mirror pair of the one or more MEMS mirror pairs to configure one of the MEMS mirrors of the MEMS mirror pair as a transmitting mirror for the LIDAR module and to configure the other one of the MEMS mirrors of the MEMS mirror pair as a receiving mirror for the LIDAR module.

In Example 41, the method according to any one of examples 37 to 40 example 33 may include one or more features according to any one of examples 1 to 36.

Example 42 is one or more non-transitory computer readable media including programmable instructions thereon, that when executed by one or more processors of a device, cause the device to perform the method according to any one of examples 37 to 41.

Example 43 is a light detection and ranging (LIDAR) module including: light detection means for detecting light; a first micro-electromechanical systems (MEMS) mirror and a second MEMS mirror, wherein one of the first MEMS mirror or the second MEMS mirror is configured to direct received light towards a field of view of the LIDAR module, wherein the other one of the first MEMS mirror or the second MEMS mirror is configured to receive light from the field of view of the LIDAR module and to direct the light towards the light detection means, and wherein the first MEMS mirror and the second MEMS mirror are configured to oscillate in synchronization with one another to cover a same angular range.

Example 44 is a LIDAR module including: a first MEMS mirror at the transmitter side and a second MEMS mirror at the receiver side, wherein the first MEMS mirror and the second MEMS mirror are configured to oscillate in synchronization with one another about a respective resonant axis (e.g., at an oscillation frequency corresponding to the resonant frequency of at least one of the first MEMS mirror and/or the second MEMS mirror, e.g. to cover a same angular range for emitting light into a field of view of the LIDAR module and for receiving light from the field of view of the LIDAR module, respectively).

In Example 45, the LIDAR module according to example 44 may include one or more features according to any one of examples 1 to 25.

The word "exemplary" is used herein to mean "serving as an example, instance, or illustration." Any example or design described herein as "exemplary" is not necessarily to be construed as preferred or advantageous over other examples or designs.

The words "plurality" and "multiple" in the description or the claims expressly refer to a quantity greater than one. The terms "group (of)", "set [of]", "collection (of)", "series (of)", "sequence (of)", "grouping (of)", etc., and the like in the description or in the claims refer to a quantity equal to or greater than one, i.e. one or more. Any term expressed in plural form that does not expressly state "plurality" or "multiple" likewise refers to a quantity equal to or greater than one.

The terms "processor" or "controller" as, for example, used herein may be understood as any kind of technological entity that allows handling of data. The data may be handled according to one or more specific functions that the processor or controller execute. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The term "connected" can be understood in the sense of a (e.g. mechanical and/or electrical), e.g. direct or indirect, connection and/or interaction. For example, several elements can be connected together mechanically such that they are physically retained (e.g., a plug connected to a socket) and electrically such that they have an electrically conductive path (e.g., signal paths exist along a communicative chain).

While the above descriptions and connected figures may depict electronic device components as separate elements, skilled persons will appreciate the various possibilities to combine or integrate discrete elements into a single element. Such may include combining two or more circuits from a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc. Also, it is appreciated that particular implementations of hardware and/or software components are merely illustrative, and other combinations of hardware and/or software that perform the methods described herein are within the scope of the disclosure.

It is appreciated that implementations of methods detailed herein are exemplary in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

While the disclosure has been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A light detection and ranging (LIDAR) module comprising:
    a light detector configured to detect light;
    a first micro-electromechanical systems (MEMS) mirror and a second MEMS mirror,
    a driving circuit configured to drive an oscillation of the first MEMS mirror and of the second MEMS mirror about a respective fast axis at a same fast driving frequency,
    wherein one of the first MEMS mirror or the second MEMS mirror is configured to direct received light towards a field of view of the LIDAR module,
    wherein the other one of the first MEMS mirror or the second MEMS mirror is configured to receive light from the field of view of the LIDAR module and to direct the light towards the light detector,
    wherein the first MEMS mirror and the second MEMS mirror are configured to oscillate in synchronization with one another to cover a same angular range,
    wherein the fast driving frequency corresponds to a resonant frequency of the first MEMS mirror and/or the second MEMS mirror,
    wherein the driving circuit is configured to provide a first driving signal at the first MEMS mirror to drive an oscillation of the first MEMS mirror about the respective fast axis,
    wherein the driving circuit is configured to provide a second driving signal at the second MEMS mirror to drive an oscillation of the second MEMS mirror about the respective fast axis, and
    wherein the driving circuit is configured to generate the second driving signal based on the first driving signal.

2. The LIDAR module according to claim 1, wherein the first MEMS mirror and the second MEMS mirror are configured to oscillate about a respective fast axis at a respective resonant frequency.

3. The LIDAR module according to claim 1, wherein the angular range comprises a first angular range along a first field of view direction and a second angular range along a second field of view direction, and wherein the first MEMS mirror and the second MEMS mirror are configured to oscillate to cover the first angular range and the second angular range in synchronization with one another.

4. The LIDAR module according to claim 1, wherein the first MEMS mirror and the second MEMS mirror have a substantially same resonant frequency.

5. The LIDAR module according to claim 4, wherein the first MEMS mirror has a first resonant frequency,
    wherein the second MEMS mirror has a second resonant frequency, and
    wherein a difference between the first resonant frequency and the second resonant frequency is in a range from 0 Hz to 10 Hz.

6. The LIDAR module according to claim 1, wherein the fast driving frequency is in a range from 15 kHz to 30 kHz.

7. The LIDAR module according to claim 1,
wherein the driving circuit is configured to determine a phase difference between a first phase of the oscillation of the first MEMS mirror about the respective fast axis and a second phase of the oscillation of the second MEMS mirror about the respective fast axis, and
wherein the driving circuit is configured to impose a delay on the second driving signal in accordance with the measured phase difference.

8. The LIDAR module according to claim 7,
wherein the delay is selected in such a way that a phase difference between the first phase of the oscillation of the first MEMS mirror about the respective fast axis and the second phase of the oscillation of the second MEMS mirror about the respective fast axis converges substantially to zero.

9. The LIDAR module according to claim 1,
wherein the driving circuit is configured to determine a phase difference between a first phase of the oscillation of the first MEMS mirror about the respective fast axis and a phase of the first driving signal, and
wherein the driving circuit is configured to vary a phase of the first driving signal in accordance with the measured phase difference.

10. The LIDAR module according to claim 1,
wherein the driving circuit comprises a first driving circuit corresponding to the first MEMS mirror and a second driving circuit corresponding to the second MEMS mirror,
wherein the first driving circuit is configured to drive an oscillation of the first MEMS mirror about the respective fast axis at a first fast driving frequency,
wherein the first fast driving frequency corresponds to a first resonant frequency of the first MEMS mirror, and
wherein the second driving circuit is configured to receive fast driving frequency information from the first driving circuit and to drive an oscillation of the second MEMS mirror about the respective fast axis at a second fast driving frequency corresponding to the first fast driving frequency.

11. The LIDAR module according to claim 1,
wherein the driving circuit is configured to drive an oscillation of the first MEMS mirror and of the second MEMS mirror about a respective slow axis at a same slow driving frequency, and
wherein the slow driving frequency is less than the resonant frequency.

12. The LIDAR module according to claim 1,
wherein the first MEMS mirror and the second MEMS mirror are selected from a plurality of MEMS mirrors formed on a same substrate.

13. A LIDAR module comprising:
a light source configured to emit light;
a light detector configured to detect light;
a first MEMS mirror and a second MEMS mirror,
wherein one of the first MEMS mirror or the second MEMS mirror is configured to receive the light that the light source emits, and to direct the light towards a field of view of the LIDAR module,
wherein the other one of the first MEMS mirror or the second MEMS mirror is configured to receive light from the field of view of the LIDAR module and to direct the light towards the light detector, and
wherein the first MEMS mirror and the second MEMS mirror have substantially a same resonant frequency; and
a driving circuit configured to drive the first MEMS mirror and the second MEMS mirror in synchronization with one another at a same fast driving frequency based on the resonant frequency about a respective fast axis to cover a same angular range,
wherein the fast driving frequency corresponds to a resonant frequency of the first MEMS mirror and/or the second MEMS mirror,
wherein the driving circuit is configured to provide a first driving signal at the first MEMS mirror to drive an oscillation of the first MEMS mirror about the respective fast axis,
wherein the driving circuit is configured to provide a second driving signal at the second MEMS mirror to drive an oscillation of the second MEMS mirror about the respective fast axis, and
wherein the driving circuit is configured to generate the second driving signal based on the first driving signal.

14. The LIDAR module according to claim 13,
wherein the driving circuit is configured to drive the first MEMS mirror and the second MEMS mirror such that the first MEMS mirror and the second MEMS mirror oscillate about a respective fast axis at the resonant frequency.

15. A method of providing MEMS mirrors for use in a LIDAR module, the method comprising:
forming a plurality of MEMS mirrors on a substrate; and
determining a resonant frequency distribution of the plurality of MEMS mirrors to select one or more MEMS mirror pairs from the plurality of MEMS mirrors,
wherein the MEMS mirrors of a MEMS mirror pair have substantially a same resonant frequency.

16. The method according to claim 15,
wherein the substrate is or comprises a semiconductor wafer.

17. The method according to claim 15,
wherein the resonant frequency distribution comprises a correlation between a position on the substrate of a MEMS mirror of the plurality of MEMS mirrors and the respective resonant frequency.

18. The method according to claim 15, further comprising:
calibrating the MEMS mirrors of at least one MEMS mirror pair of the one or more MEMS mirror pairs to configure one of the MEMS mirrors of the MEMS mirror pair as a transmitting mirror for the LIDAR module and to configure the other one of the MEMS mirrors of the MEMS mirror pair as a receiving mirror for the LIDAR module.

* * * * *